US012666634B2

(12) United States Patent
Lee

(10) Patent No.: US 12,666,634 B2
(45) Date of Patent: Jun. 23, 2026

(54) SEMICONDUCTOR DEVICE INCLUDING SUPPORTER

(71) Applicant: Samsung Electronics Co., Ltd., Suwon-si (KR)

(72) Inventor: Jong-Min Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 390 days.

(21) Appl. No.: 18/309,126

(22) Filed: Apr. 28, 2023

(65) Prior Publication Data

US 2024/0038830 A1 Feb. 1, 2024

(30) Foreign Application Priority Data

Jul. 29, 2022 (KR) ........................ 10-2022-0094654

(51) Int. Cl.
*H10D 1/68* (2025.01)
*H10B 12/00* (2023.01)

(52) U.S. Cl.
CPC ........... *H10D 1/716* (2025.01); *H10B 12/315* (2023.02); *H10B 12/482* (2023.02)

(58) Field of Classification Search
CPC .............................. H01L 28/92; H01L 27/108
See application file for complete search history.

(56) References Cited

U.S. PATENT DOCUMENTS 8,129,769 B2 3/2012 Kadoya
10,411,016 B2 9/2019 Kim et al.

10,998,318 B2 * 5/2021 Choo ..................... H10B 12/30
11,251,262 B2 * 2/2022 Hsiao ................. H01L 21/3065
2009/0212338 A1 * 8/2009 Benson ................ H10B 12/033
257/306

(Continued)

FOREIGN PATENT DOCUMENTS

KR 10-2014-0065186 A 5/2014
KR 10-2018-0007171 A 1/2018

(Continued)

OTHER PUBLICATIONS

European Search Report dated Jan. 31, 2024 issued in corresponding European Appln. No. 23184834.2.

(Continued)

*Primary Examiner* — Steven M Page
(74) *Attorney, Agent, or Firm* — Harness, Dickey & Pierce, P.L.C.

(57) ABSTRACT

A semiconductor device including a substrate; a plurality of lower electrodes on the substrate arranged in a honeycomb structure; and a supporter connecting the plurality of lower electrodes to each other. The supporter has a plurality of supporter holes defined therein, each of the plurality of supporter holes exposes at least a portion of each of the plurality of lower electrodes. The supporter includes a plurality of first extensions extending in a first direction; and a plurality of second extensions extending in a second direction so as to intersect the plurality of first extensions. Each of the plurality of first extensions has first and second sidewalls, each of the plurality of second extensions has third and fourth sidewalls, and each of the first to fourth sidewalls includes a convex portion and a concave portion.

20 Claims, 35 Drawing Sheets

(56)  References Cited

U.S. PATENT DOCUMENTS

| | | | |
|---|---|---|---|
| 2015/0060970 A1* | 3/2015 | Sasaki | H10D 1/716 |
| | | | 257/532 |
| 2016/0365409 A1* | 12/2016 | Lee | H10D 1/716 |
| 2018/0211962 A1 | 7/2018 | Kim et al. | |
| 2020/0006345 A1* | 1/2020 | Choo | H10D 1/716 |
| 2020/0152584 A1 | 5/2020 | Sohn | |
| 2020/0194437 A1 | 6/2020 | Song et al. | |
| 2021/0043722 A1* | 2/2021 | Cho | H10B 12/00 |
| 2021/0202371 A1* | 7/2021 | Han | H01L 24/06 |
| 2022/0149153 A1 | 5/2022 | Kim et al. | |

FOREIGN PATENT DOCUMENTS

| | | |
|---|---|---|
| KR | 10-2018-0063944 A | 6/2018 |
| KR | 10-2018-0065425 A | 6/2018 |
| KR | 10-2018-0066422 A | 6/2018 |
| KR | 10-2018-0068584 A | 6/2018 |
| KR | 10-2020-0112218 A | 10/2020 |

OTHER PUBLICATIONS

European Office Action dated Feb. 13, 2024 issued in corresponding European Appln. No. 23184834.2.
Taiwanese Office Action dated Mar. 12, 2024 issued in corresponding Taiwanese Appln. No. 112127862.
Korean Office Action dated Feb. 13, 2026 issued in corresponding Korean Patent Application No. 10-2022-0094654.

* cited by examiner

220A

160(CAP)

230A

242A

240A

260A

DR2

DR5 DR1

SEMICONDUCTOR DEVICE INCLUDING SUPPORTER

CROSS-REFERENCE TO RELATED APPLICATION

This application claims priority from Korean Patent Application No. 10-2022-0094654 filed on Jul. 29, 2022 in the Korean Intellectual Property Office, and all the benefits accruing therefrom under 35 U.S.C. 119, the contents of which are incorporated in their entirety by reference.

BACKGROUND

Field

The present disclosure relates to a semiconductor device.

Description of Related Art

As a semiconductor device become more highly integrated, individual circuit patterns are becoming smaller in order to implement a larger number of semiconductor devices in the same area. That is, a design rule for components of the semiconductor device is decreasing size. As a DRAM device becomes more highly integrated, a size of a capacitor becomes smaller. A lower electrode with a high aspect ratio is desired for a capacitor to have a predefined capacitance. A supporter pattern to support the lower electrode is desired to prevent the lower electrode from collapsing during a process.

SUMMARY

The present disclosure provides a semiconductor device capable of preventing or hindering contact between lower electrodes.

The present disclosure is not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an example embodiment of the present disclosure, there is provided a semiconductor device comprising: a substrate; a plurality of lower electrodes on the substrate and arranged in a honeycomb structure; and a supporter connecting the plurality of lower electrodes to each other, wherein the supporter has a plurality of supporter holes defined therein, wherein each of the plurality of supporter holes exposes at least a portion of each of the plurality of lower electrodes, wherein the supporter includes: a plurality of first extensions extending in a first direction, and the plurality of first extensions arranged in a second direction perpendicular to the first direction; and a plurality of second extensions extending in the second direction so as to intersect the plurality of first extensions, and the plurality of second extensions arranged in the first direction, wherein each of the plurality of first extensions has first and second sidewall opposite to each other in the second direction, wherein each of the plurality of second extensions has third and fourth sidewalls opposite to each other in the first direction, wherein each of the first to fourth sidewalls includes a convex portion and a concave portion.

According to another example embodiment of the present disclosure, there is provided a semiconductor device comprising: a substrate; a plurality of lower electrodes on the substrate and arranged in a honeycomb structure; and a supporter connecting the plurality of lower electrodes to each other, wherein the supporter has a plurality of supporter holes defined therein, wherein each of the plurality of supporter holes exposes at least a portion of at least one of the plurality of lower electrodes, wherein the supporter includes: a plurality of first extensions extending in a first direction and the plurality of first extensions arranged in a second direction perpendicular to the first direction; and a plurality of second extensions extending in the second direction so as to intersect the plurality of first extensions, wherein the plurality of second extensions are arranged in the first direction, wherein the plurality of supporter holes include a first supporter hole, wherein the plurality of first extensions include a first sub-extension and a second sub-extension defining the first supporter hole, wherein the plurality of second extensions include a third sub-extension and a fourth sub-extension defining the first supporter hole, wherein at least one of the first to fourth sub-extensions has a convex portion toward the first supporter hole.

According to another example embodiment of the present disclosure, there is provided a semiconductor device comprising: a substrate; a plurality of lower electrodes on the substrate and arranged in a honeycomb structure; and a supporter connecting the plurality of lower electrodes to each other, wherein the supporter has a plurality of supporter holes defined therein, wherein each of the plurality of supporter holes exposes at least a portion of each of the plurality of lower electrodes, wherein the supporter includes: a plurality of first extensions extending in a first direction and the plurality of first extensions arranged in a second direction perpendicular to the first direction; and a plurality of second extensions extending in the second direction so as to intersect the plurality of first extensions, wherein the plurality of second extensions are arranged in the first direction, wherein the plurality of lower electrodes include first to fourth lower electrodes arranged in a quadrangle manner, wherein a first supporter hole of the plurality of supporter holes exposes at least a portion of each of the first to fourth lower electrodes, wherein the first and second lower electrodes are adjacent to each other in a third direction, the third direction being between the first direction and the second direction, wherein the third and fourth lower electrodes are respectively adjacent to the first and second lower electrodes in the first direction.

Other details of the present disclosure are included in following detailed descriptions and drawings.

BRIEF DESCRIPTION OF DRAWINGS

The above and other features of the present disclosure will become more apparent by describing in detail illustrative example embodiments thereof with reference to the attached drawings, in which.

DETAILED DESCRIPTIONS

Figure 1:
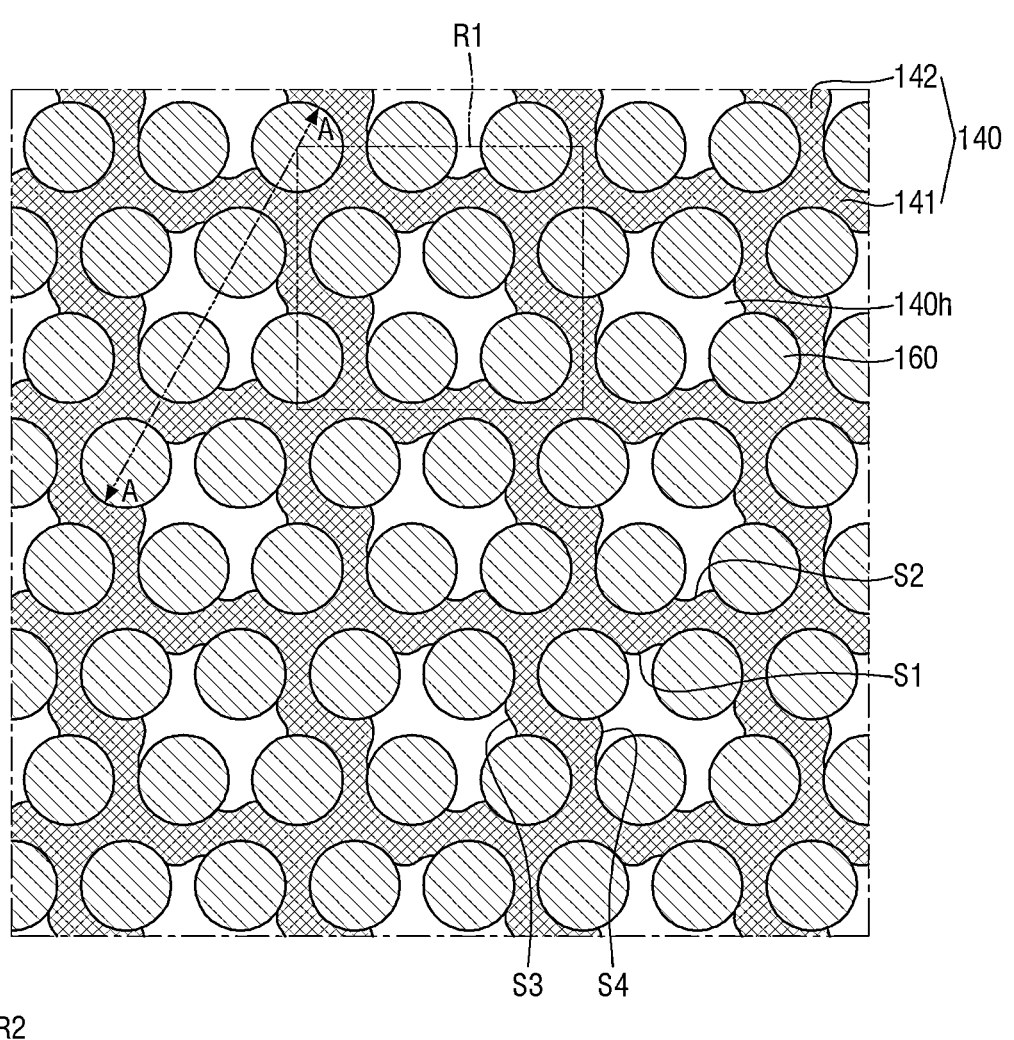
FIG. 1 is a plan view for illustrating a semiconductor device according to some example embodiments.
Figure 1:
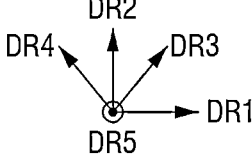
Figure 2:
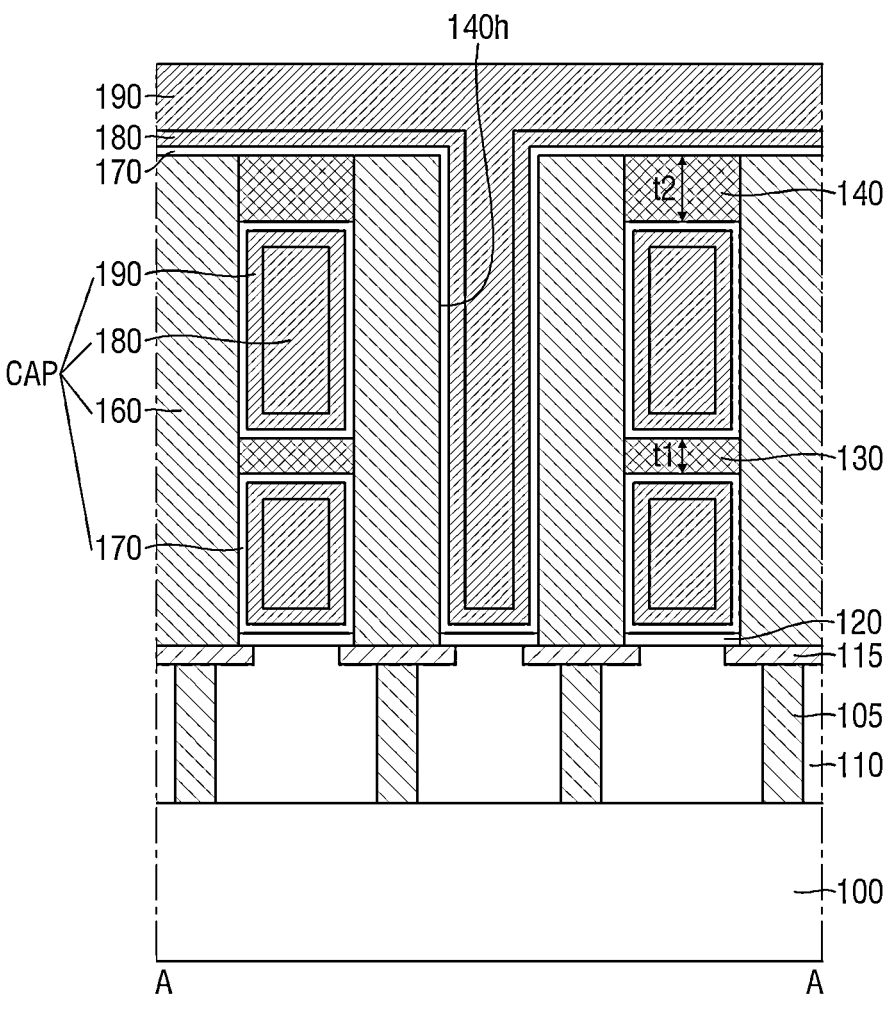
FIG. 2 is a cross-sectional view taken along a line A-A of FIG. 1.

FIG. 1 is a plan view for illustrating a semiconductor device according to some example embodiments. FIG. 2 is a cross-sectional view taken along a line A-A of FIG. 1. FIG. 3 to FIG. 6 are enlarged views of a R1 area of FIG. 1.

Referring to FIG. 1 and FIG. 2, the semiconductor device according to some example embodiments may include a substrate 100, a first interlayer insulating film 110, a first landing pad 115, a first etch stop film 120, first and second supporters (first and second support structures) 130 and 140, and a capacitor CAP.

The substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, a lead telluride compound, indium arsenide, indium phosphide, gallium arsenide or gallium antimonide. However, the present disclosure is not limited thereto. In a following description, an example in which the substrate 100 is embodied as the silicon substrate is described.

The first landing pad 115 may be disposed on the substrate 100. The first landing pad 115 may be connected to the substrate 100. The first landing pad 115 may be electrically connected to a conductive area formed on or within the substrate 100. The first landing pad 115 may be connected to the substrate 100 via a first storage contact 105. The first landing pad 115 may be disposed on the first storage contact 105.

The first interlayer insulating film 110 may be disposed on the substrate 100. The first storage contact 105 and the first landing pad 115 may be disposed in the first interlayer insulating film 110 while being disposed on the substrate 100. The substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, a lead telluride compound, indium arsenide, indium phosphide, gallium arsenide or gallium antimonide. However, the present disclosure is not limited thereto. In a following description, an example in which the substrate 100 is embodied as the silicon substrate is described.

The first interlayer insulating film 110 may include, for example, at least one of silicon oxide, silicon nitride, silicon oxynitride (SiON), silicon oxycarbonitride (SiOCN), and combinations thereof. The first storage contact 105 may include, for example, at least one of a semiconductor material doped with impurities, a conductive silicide compound, a conductive metal nitride, and a metal. The first landing pad 115 may include, for example, at least one of an impurity-doped semiconductor material, a conductive silicide compound, a conductive metal nitride, and a metal. In the semiconductor device according to some example embodiments, the first landing pad 115 may include tungsten (W).

The first etch stop film 120 may be disposed on the first interlayer insulating film 110. The first etch stop film 120 may expose at least a portion of the first landing pad 115. In one example, the first etch stop film 120 may be disposed on the first landing pad 115. The first etch stop film 120 may include an electrode pad opening exposing at least a portion of the first landing pad 115. The first etch stop film 120 may include, for example, at least one of silicon nitride (SiN), silicon carbonitride (SiCN), silicon boron nitride (SiBN), silicon carbon oxide (SiCO), silicon oxynitride (SiON), silicon oxide (SiO), and silicon oxycarbonitride (SiOCN). For example, silicon carbide (SiCO) is composed of silicon (Si), carbon (C) and oxygen (O), wherein a ratio between contents of silicon (Si), carbon (C) and oxygen (O) is not limited to a specific value.

The capacitor CAP may be disposed on the first landing pad 115. The capacitor CAP may include a lower electrode 160, a capacitor dielectric film 170, an upper electrode 180 and an upper plate electrode 190.

A plurality of lower electrodes 160 may be disposed on the substrate 100. Each of (or alternatively, at least one of) the lower electrodes 160 may be disposed on the first landing pad 115. The lower electrode 160 may be connected to the first landing pad 115. A portion of the lower electrode 160 may be disposed in the first etch stop film 120. The lower electrode 160 may extend through the first etch stop film 120 and then be connected to the first landing pad 115.

The lower electrodes 160 may be arranged in a honeycomb structure in which the lower electrodes 160 may be respectively disposed at a center of a hexagon and vertices thereof. The lower electrodes 160 may be spaced from each other by a regular spacing. The plurality of lower electrodes 160 may be repeatedly arranged along a first direction DR1 and a second direction DR2 perpendicular to each other. The lower electrodes 160 arranged repeatedly in the second direction DR2 may be arranged in a zigzag manner. The lower electrodes 160 may be arranged linearly along a third direction DR3 or a fourth direction DR3. The third direction DR3 may be a direction between the first direction DR1 and the second direction DR2. The fourth direction DR4 may be a direction perpendicular to the third direction DR3 while the second direction DR2 is interposed therebetween.

In some example embodiments, each lower electrode 160 may have a pillar shape (e.g. a cylinder). The lower electrode 160 may extend in an elongated manner in a thickness direction of the substrate 100, that is, a fifth direction DR5. A length by which the lower electrode 160 extends in the fifth direction DR5 is greater than a length by which the lower electrode 160 extends in each of the directions DR1, DR2, DR3, and DR4 parallel (or alternatively, a substantially parallel) to a top face of the substrate 100. The fifth direction DR5 may be a direction perpendicular to the top face of the substrate 100.

The lower electrode 160 may include, for example, a doped semiconductor material, a conductive metal nitride such as titanium nitride, tantalum nitride, niobium nitride or tungsten nitride, etc. a metal such as ruthenium, iridium, titanium or tantalum, etc., or a conductive metal oxide such as iridium oxide or niobium oxide, etc. However, the present disclosure is not limited thereto. In the semiconductor device according to some example embodiments, the lower electrode 160 may include titanium nitride (TiN).

The first and second supporters 130 and 140 may be disposed between adjacent ones of the plurality of lower electrodes 160. The first and second supporters 130 and 140 may be disposed between lower electrodes 160 adjacent to each other. The first and second supporters 130 and 140 may contact the lower electrode 160. The first and second supporters 130 and 140 may be in contact with a portion of a sidewall of the lower electrode 160.

The first and second supporters 130 and 140 may connect the plurality of lower electrodes 160 to each other and support the plurality of lower electrodes 160. The second supporter 140 may be disposed above the first supporter 130. The second supporter 140 may be spaced apart from the first supporter 130. In some example embodiments, a top face of the second supporter 140 may be coplanar with a top face of the lower electrode 14. Restated, the top surface of the second supporter 140 may have the same height relative to the substrate 100 as the top surface of the first supporter 130.

The first supporter 130 may be disposed on the first etch stop film 120. The first supporter 130 may be disposed to be spaced apart from the first etch stop film 120. The second supporter 140 may be disposed above the first supporter 130. The second supporter 140 may be disposed to be spaced apart from the first supporter 130.

In the semiconductor device according to some example embodiments, a thickness t2 of the second supporter 140 in the fifth direction DR5 may be greater than a thickness t1 of the first supporter 130 in the fifth direction DR5. Unlike what is illustrated, the first supporter 130 including an insulating material may not be disposed between the second supporter 140 and the first etch stop film 120. That is, a single supporter may support the lower electrode 160.

Each of (or alternatively, at least one of) the first supporter 130 and the second supporter 140 may include, for example, at least one of silicon oxynitride (SiON), silicon nitride (SiN), silicon carbon nitride (SiCN), and tantalum oxide (TaO). For example, the first supporter 130 and the second supporter 140 may include the same material as each other. However, the technical spirit of the present disclosure is not limited thereto. In some other example embodiments, the first supporter 130 and the second supporter 140 may include different materials.

The first supporter 130 may include a plurality of supporter holes corresponding to a plurality of supporter holes 140h of the second supporter 140. The plurality of supporter holes 140h of the second supporter 140 may be respectively aligned with the plurality of supporter holes of the first supporter 130 in the fifth direction DR5 of the substrate 100.

The second supporter 140 may include the plurality of supporter holes 140h. The support hole 140h may expose at least a portion of the lower electrode 160. The supporter hole 140h may expose at least a portion of each of the plurality of lower electrodes 160. That is, the supporter hole 140h may expose at least a portion of each of all of the lower electrodes 160.

The support holes 140h may be arranged in the first direction DR1 and the second direction DR2. The support holes 140h may be arranged in a lattice pattern. The supporter hole 140h may have a rectangular shape having four curved sides. The lower electrodes 160 may be disposed at vertices of the rectangular shape, respectively. The support hole 140h may be disposed between two lower electrodes 160 adjacent to each other in the third direction DR3 or the fourth direction DR4. The support hole 140h may expose at least a portion of each of the four lower electrodes 160. The support hole 140h may be defined by the second supporter 140 and the lower electrodes 160.

The second supporter 140 may have a grid structure. The second supporter 140 may include a plurality of first extensions 141 extending in the first direction DR1 and arranged in the second direction DR2, and a plurality of second extensions 142 extending in the second direction DR2 and arranged in the first direction DR1. The second extension 142 may intersect the first extension 141. The second direction DR2 may be perpendicular to the first direction DR1.

In some example embodiments, the second supporter 140 may have a wavy shape. Each of (or alternatively, at least one of) the first and second extensions 141 and 142 may have a wavy shape (e.g. a shape that changes curvature along the extension of the first and second extensions 141 and 142). The first extension 141 may include a first sidewall S1 and a second sidewall S2 opposite to each other in the second direction DR2. The second extension 142 may include a third sidewall S3 and a fourth sidewall S4 opposite to each other in the first direction DR1. Each of (or alternatively, at least one of) the first to fourth sidewalls S1, S2, S3, and S4 may include a concave portion and a convex portion. Thus, a curvature of the first to fourth sidewalls S1, S2, S3, and S4 may change as the sidewall extends between adjacent or neighboring lower electrodes 160. Each of (or alternatively, at least one of) the first to fourth sidewalls S1, S2, S3, and S4 may further include a flat portion. That is, each of (or alternatively, at least one of) the sidewalls defining the supporter hole 140h may include the concave portion and the convex portion, and may further include the flat portion.

Figure 3:
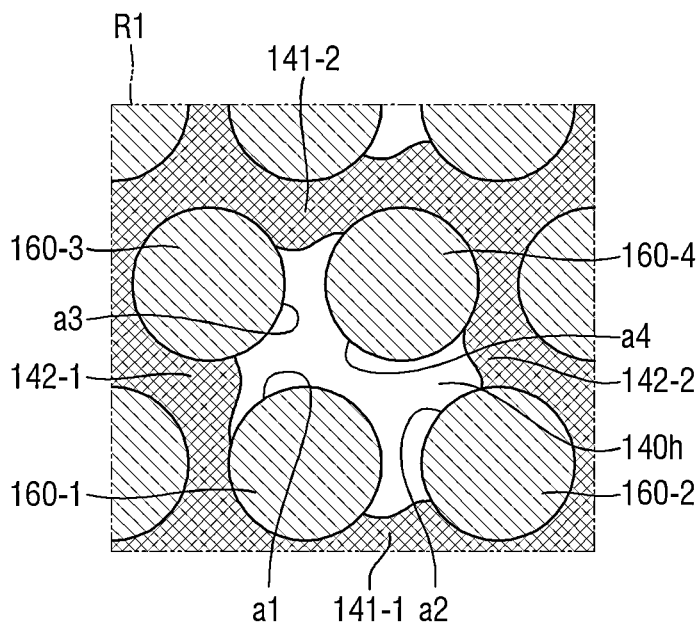
FIG. 3 to FIG. 6 are enlarged views of a R1 area of FIG. 1.

Referring to FIG. 3, the support hole 140h may be disposed between two lower electrodes 160 neighboring each other in the third direction DR3 and two lower electrodes 160 neighboring each other in the fourth direction DR4. First to fourth lower electrodes 160-1, 160-2, 160-3, and 160-4 may be respectively disposed at vertices of one supporter hole 140h. The supporter hole 140h may expose at least a portion of each of the first to fourth lower electrodes 160-1, 160-2, 160-3, and 160-4. The first to fourth lower electrodes 160-1, 160-2, 160-3, and 160-4 may be adjacent to each other around a center of the supporter hole 140h. The first and second lower electrodes 160-1 and 160-2 may be adjacent to each other in the first direction DR1, and the third and fourth lower electrodes 160-3 and 160-4 may be adjacent to each other in the first direction DR1. The first and fourth lower electrodes 160-1 and 160-4 may be adjacent to each other in the third direction DR3. The second and third lower electrodes 160-2 and 160-3 may be adjacent to each other in the fourth direction DR4.

The support hole 140h may be defined by a first-first extension 141-1 and a first-second extension 141-2 neighboring each other in the second direction DR2, a second-first extension 142-1 and a second-second extension 142-2 neighboring each other in the first direction DR1, and the first to fourth lower electrodes 160-1, 160-2, 160-3, and 160-4.

The supporter hole 140h may have a quadrangular shape having four curved sides, and the first to fourth lower electrodes 160-1, 160-2, 160-3, and 160-4 may be disposed at the vertices of the quadrangular shape, respectively. Each of (or alternatively, at least one of) the first-first extension 141-1, the first-second extension 141-2, the second-first extension 142-1, and the second-second extension 142-2 which define the supporter hole 140h may have a convex portion toward the supporter hole 140h. At least one of the second sidewall S2 of the first-first extension 141-1, the first sidewall S1 of the first-second extension 141-2, the third sidewall S3 of the second-first extension 142-1, and the fourth sidewall S4 of the second-second extension 142-2 defining the supporter hole 140h may include a convex portion toward the supporter hole 140h. For example, each of the first to fourth sidewalls S1, S2, S3, and S4 defining the supporter hole 140h may include a convex portion toward the supporter hole 140h. Each of the first to fourth sidewall S1, S2, S3, and S4 defining the supporter hole 140h may further include a concave portion or a flat portion.

At least two of areas a1, a2, a3, and a4 by which the first to fourth lower electrodes 160-1, 160-2, 160-3, and 160-4 are respectively exposed through the supporter hole 140h may be different from each other. Two areas by which two lower electrodes adjacent to each other in the first direction DR1 or the second direction DR2 are respectively exposed though the support hole 140h may have different area sizes.

The area a1 by which the first lower electrode 160-1 is exposed through the supporter hole 140h may be larger than the area a2 by which the second lower electrode 160-2 is exposed through the supporter hole 140h. The area a3 by which the third lower electrode 160-3 is exposed through the supporter hole 140h may be greater than the area a4 by which the fourth lower electrode 160-4 is exposed through the supporter hole 140h. The area a1 by which the first lower electrode 160-1 is exposed through the supporter hole 140h may be larger than the area a3 by which the third lower electrode 160-3 is exposed through the supporter hole 140h. The area a4 by which the fourth lower electrode 160-4 is exposed through the supporter hole 140h may be greater than the area a2 by which the second lower electrode 160-2 is exposed through the supporter hole 140h.

In some example embodiments, two areas by which two lower electrodes adjacent to each other in a diagonal direction between the first direction DR1 and the second direction DR2 are respectively exposed through the supporter hole 140h may be different from each other. The four areas by which the four lower electrodes are respectively exposed through the support hole 140h may be different from each other. That is, the areas a1, a2, a3, and a4 by which the first to fourth lower electrodes 160-1, 160-2, 160-3, and 160-4 are respectively exposed through the supporter hole 140h may be different from each other.

Figure 4:
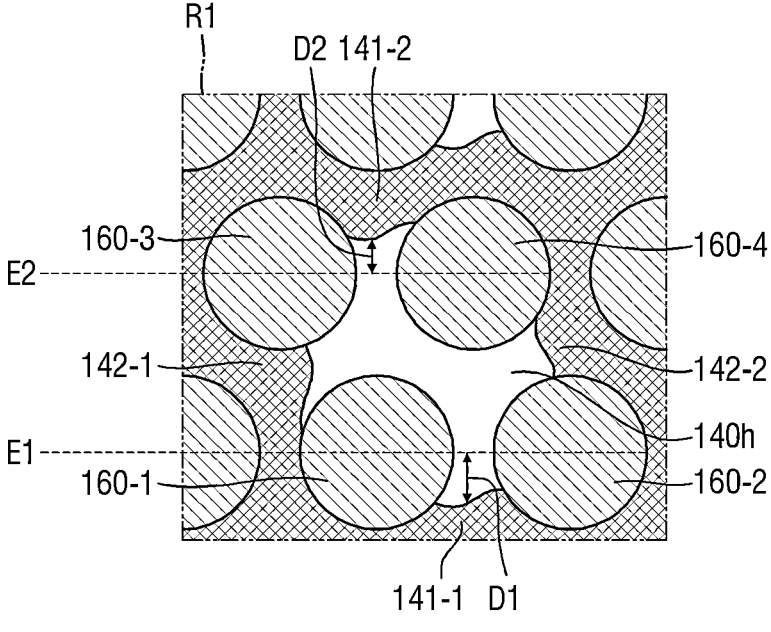

Referring to FIG. 4, in the semiconductor device according to some example embodiments, the first-first extension 141-1 defining the supporter hole 140h may be spaced apart from a first extension line E1 passing through centers of the first and second lower electrodes 160-1 and 160-2 and extending in the first direction DR1. The first-first extension 141-1 may be disposed below the first extension line E1 in the second direction DR2. A first distance D1 from the first extension line E1 to the first-first extension 141-1 may not be constant as the first-first extension 141-1 extends away from the first lower electrode 160-1.

The first-second extension 141-2 defining the support hole 140h may be spaced apart from a second extension line E2 extending in the first direction DR1 and passing through centers of the third and fourth lower electrodes 160-3 and 160-4. The first-second extension 141-2 may be disposed above the second extension line E2 in the second direction DR2. A second distance D2 from the second extension line E2 to the first-second extension 141-2 may not be constant as the first-second extension 141-2 extends away from the third lower electrode 160-3.

In some example embodiments, the first distance D1 from the first extension line E1 to the first-first extension 141-1 may be different from the second distance D2 from the second extension line E2 to the first-second extension 141-2. For example, the first distance D1 may be greater than the second distance D2.

The lower electrode 160 may include a first portion defining the supporter hole 140h and a second portion not defining the supporter hole 140h. Due to first and second supporters 130 and 140, the first portion has a larger area in which the upper electrode 180 and the capacitor dielectric film 170 are disposed than the second portion. Thus, the lower electrode 160 may be subjected to stress in a direction perpendicular to an interface between the lower electrode 160 and the supporter hole 140h and toward the supporter hole 140h, and may be bent in the direction toward the supporter hole 140h.

When the support hole 140h is disposed between first and second lower electrodes adjacent to each other in the first direction DR1, the first lower electrode may be subjected to stress in an opposite direction to the first direction DR1, and the second lower electrode may be subjected to stress in the first direction DR1. Accordingly, the first lower electrode may be bent toward the second lower electrode, and the second lower electrode may be bent toward the first lower electrode. That is, the direction of the stress applied to the first lower electrode and the direction of the stress applied to the second lower electrode may be in the same line. The first lower and second electrodes may be bent toward a space between the first and second lower electrodes in the first direction DR1. Thus, the first and second lower electrodes may contact each other, resulting in a defect.

However, in the semiconductor device according to some example embodiments, the supporter hole 140h may be disposed between the lower electrodes 160 adjacent to each other in the third direction DR3 or the fourth direction DR4. For example, the first lower electrode 160-1 is the opposite direction of the third direction DR3, the second lower electrode 160-2 may be subjected to stress in the third direction DR3, the third lower electrode 160-3 may be subjected to stress in the fourth direction DR4, and the fourth lower electrode 160-4 may be subjected to stress in the opposite direction to the fourth direction DR4. That is, the directions of the stresses respectively applied to the lower electrodes 160 adjacent to each other in the third direction DR3 or the fourth direction DR4 is not in the same line. This may prevent or hinder the contact between the lower electrodes adjacent to each other.

Figure 5:
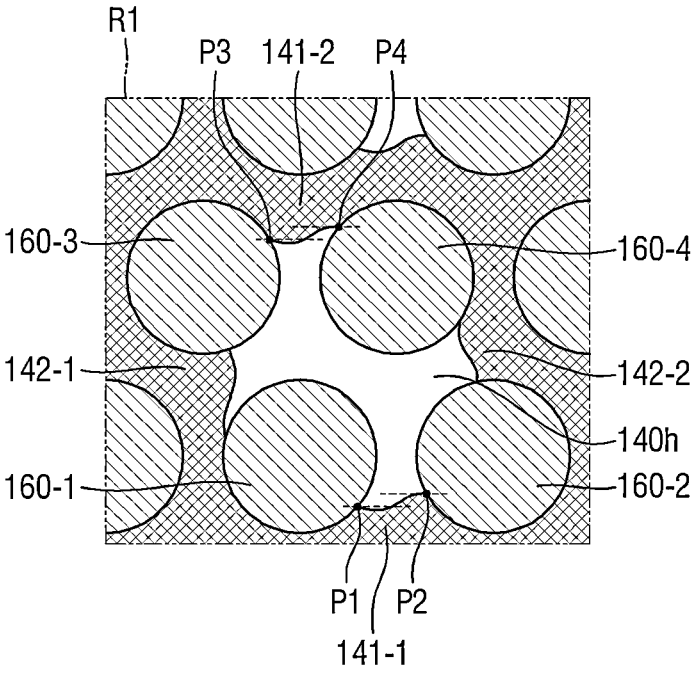

Referring to FIG. 5, in the semiconductor device according to some example embodiments, a first point P1 at which the first-first extension 141-1 and the first lower electrode 160-1 meet each other and a second point P2 where the first-second extension 141-2 and the second lower electrode 160-2 meet each other may be positioned at different positions in the second direction DR2. The first point P1 and the second point P2 may not be in the same line parallel to the first direction DR1. The first point P1 may be disposed below the second point P2 in the second direction DR2.

In the semiconductor device according to some example embodiments, a third point P3 where the first-second extension 141-2 and the third lower electrode 160-3 meet each other and a fourth point P4 where the first-second extension 141-2 and the fourth lower electrode 160-4 meet each other may be positioned at different positions in the second direction DR2. The third point P3 and the fourth point P4 may not be in the same line parallel to the first direction DR1. The third point P3 may be disposed below the fourth point P4 in the second direction DR2.

Figure 6:
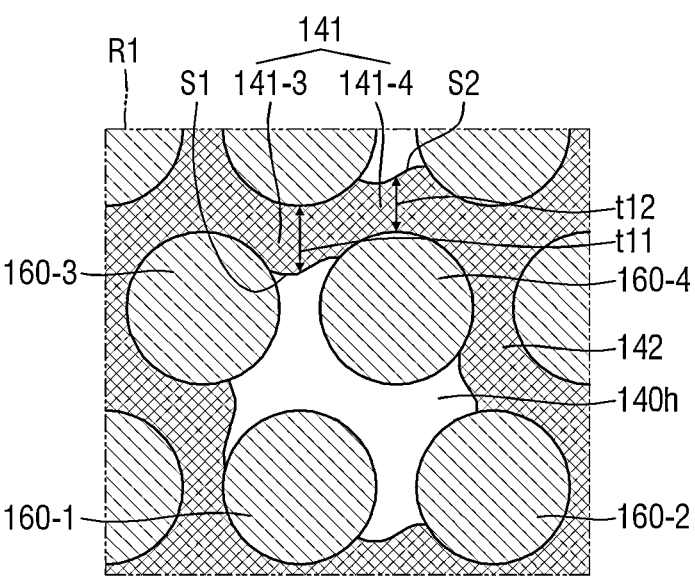

Referring to FIG. 6, in the semiconductor device according to some example embodiments, the first extension 141 may include a first portion 141-3 and a second portion 141-4. The lower electrode 160-1 is disposed on the second sidewall S2 of the first portion 141-3. The electrode 160-4 is disposed on the first sidewall S2 of the second portion 141-4. Each of the first sidewall S1 of the first portion 141-3 and the second sidewall S2 of the second portion 141-4 may partially define the supporter hole 140h.

A first thickness t11 of the first portion 141-3 and a second thickness t12 of the second portion 141-4 may be different from each other. The first thickness t11 may be smaller than the second thickness t12.

Referring back to FIG. 2, the capacitor dielectric film 170 may be disposed on the plurality of lower electrodes 160, the first supporter 130, and the second supporter 140. The capacitor dielectric film 170 may extend along profiles of the lower electrodes 160, top and bottom faces of the first supporter 130, and top and bottom faces of the second supporter 140.

The capacitor dielectric film 170 may include a high-k material including, for example, silicon oxide, silicon nitride, silicon oxynitride and metal. Although it is illustrated that the capacitor dielectric film 170 is embodied as a single film, this is only for convenience of illustration, and the present disclosure is not limited thereto.

The upper electrode 180 may be disposed on the capacitor dielectric film 170. The upper electrode 180 may extend along a profile of the capacitor dielectric film 170. The upper plate electrode 190 may be disposed on the upper electrode 180. The upper electrode 180 may be disposed between the capacitor dielectric film 170 and the upper plate electrode 190.

The upper electrode 180 may be made of, for example, a doped semiconductor material, a conductive metal nitride such as titanium nitride, tantalum nitride, niobium nitride or tungsten nitride, a metal such as ruthenium, iridium, titanium or tantalum, and the like, or a conductive metal oxide such as iridium oxide or niobium oxide. However, the present disclosure is not limited thereto.

The upper plate electrode 190 may include, for example, at least one of an elemental semiconductor material film or a compound semiconductor material film. The upper plate electrode 190 may contain doped n-type impurities or p-type impurities.

Figure 7:
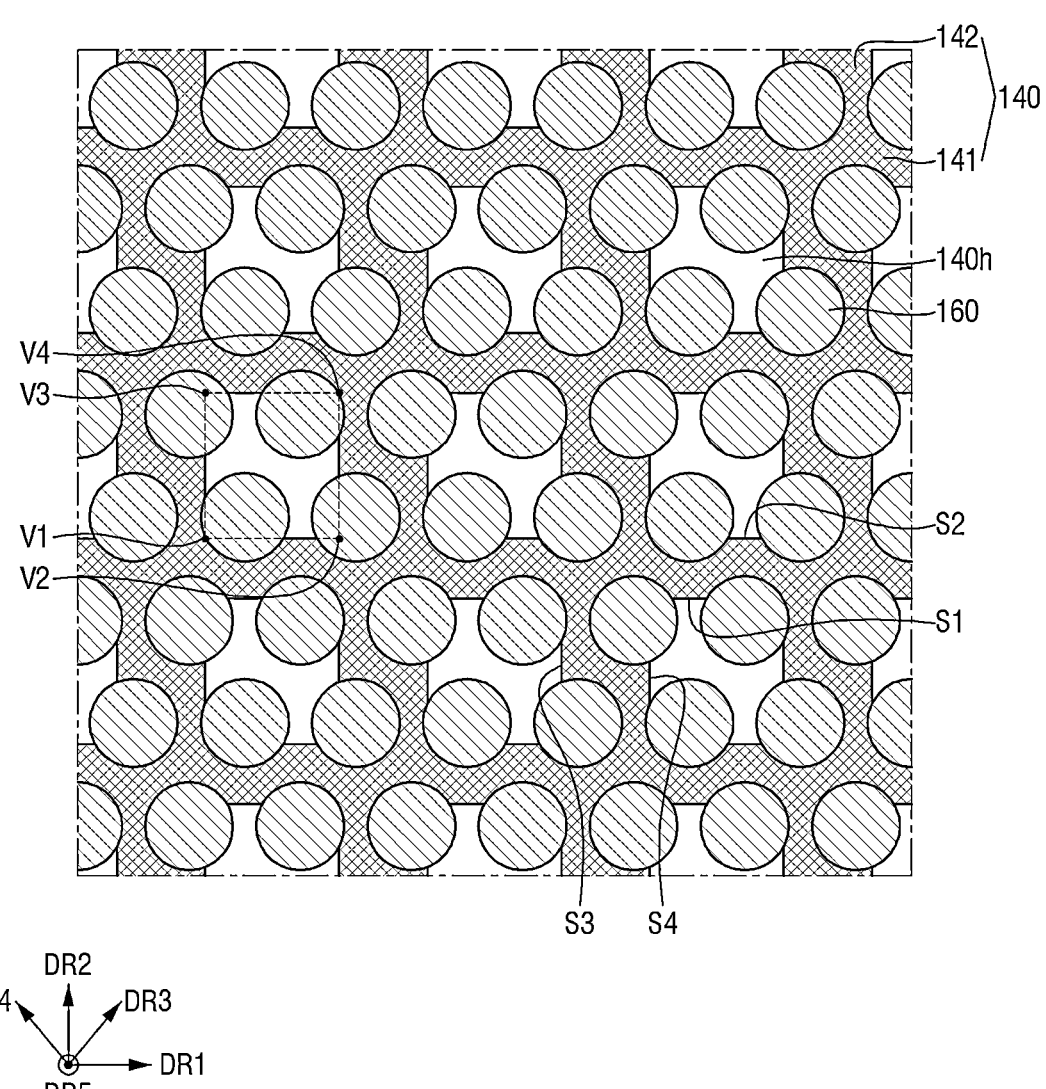
FIGS. 7 and 8 are plan views for illustrating semiconductor devices according to some example embodiments, respectively.
Figure 8:
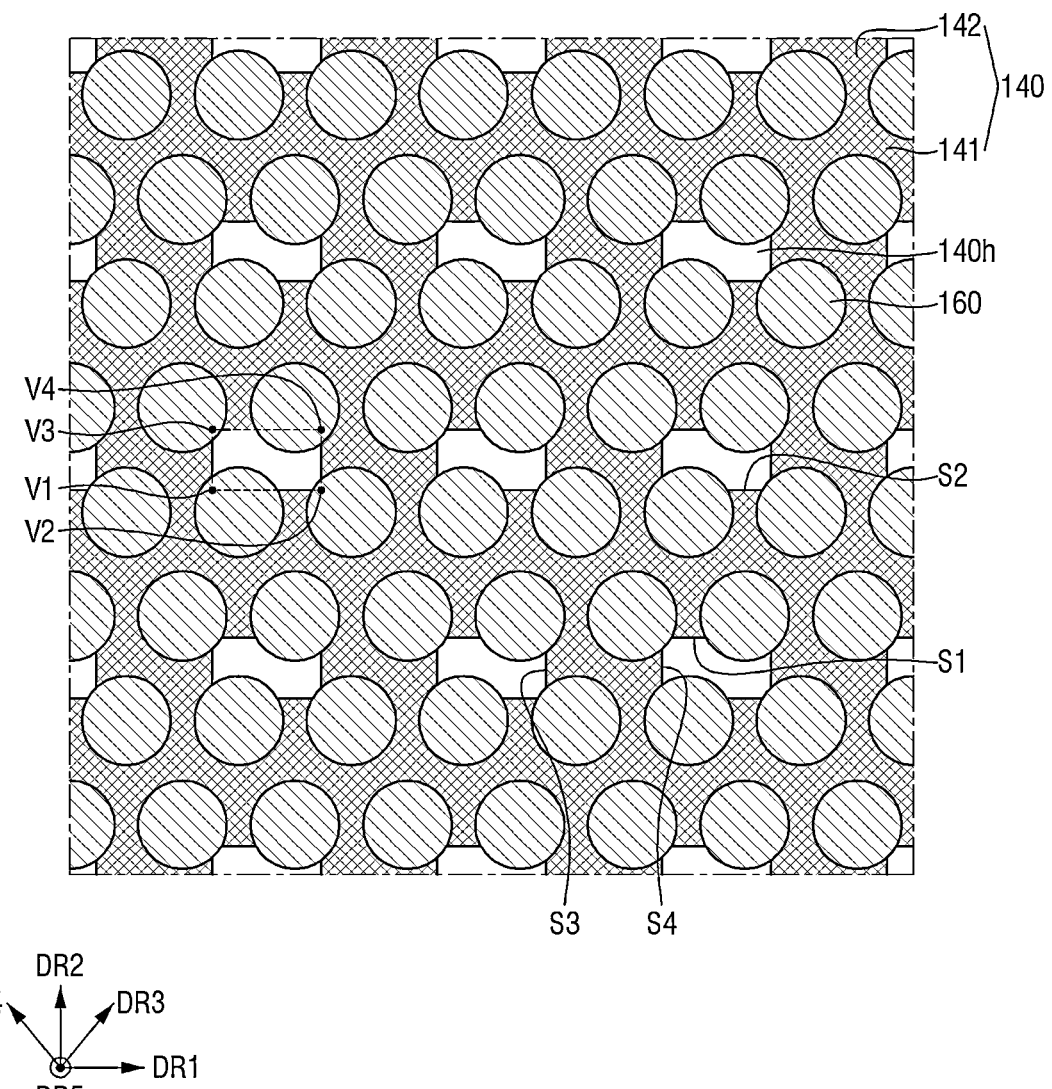

FIGS. 7 and 8 are plan views for illustrating semiconductor devices according to some example embodiments, respectively. For convenience of description, following descriptions are based on differences from those as described above with reference to FIG. 1 to FIG. 6.

Referring to FIG. 7 and FIG. 8, in the semiconductor device according to some example embodiments, the supporter hole 140h may have various sizes as long as the supporter hole 140h exposes each of the first to fourth lower electrodes 160-1, 160-2, 160-3, and 160-4 adjacent to each other and has a rectangular shape. When a thickness of the second supporter 140 is large, the lower electrode 160 may be more effectively prevented or hindered from being bent. When the thickness of the second supporter 140 is small, the capacitor dielectric film 170, the upper electrode 180, and the upper plate electrode 190 may be more advantageously formed.

Referring to FIG. 7, the supporter hole 140h may have a rectangular shape having four straight lines, and the lower electrode 160 may be respectively disposed at vertices V1, V2, V3, and V4 of the rectangular shape. The vertices V1, V2, V3, and V4 of the rectangular shape may be disposed in the lower electrodes 160, respectively. Each of centers of the lower electrodes 160 disposed at the vertices V1, V2, V3, and V4 of the rectangle, respectively and each of the vertices V1, V2, V3, and V4 of the rectangle are not in a straight line extending in the first direction DR1 or the second direction DR2.

Each of (or alternatively, at least one of) first to fourth sidewalls S1, S2, S3, and S4 of the second supporter 140 may be flat. Each of (or alternatively, at least one of) the first to fourth sidewall S1, S2, S3, and S4 of the second supporter 140 may extend in a straight line extending in the first direction DR1 or the second direction DR2. For example, a distance in the second direction DR2 between the first sidewall S1 and the second sidewall S2 may be substantially constant along the first direction DR1. A distance in the first direction DR1 between the third sidewall S3 and the fourth sidewall S4 may be substantially constant in the second direction DR2. The first extension 141 and the second extension 142 of the second supporter 140 may be perpendicular (or alternatively, a substantially perpendicular) to each other.

Referring to FIG. 8, in a semiconductor device according to some example embodiments, a dimension in the first direction DR1 of the supporter hole 140h may be greater than a dimension in the second direction DR2 thereof. The dimension in the second direction DR2 of the second supporter 140 in FIG. 8 may be larger than that in FIG. 7.

Figure 9:
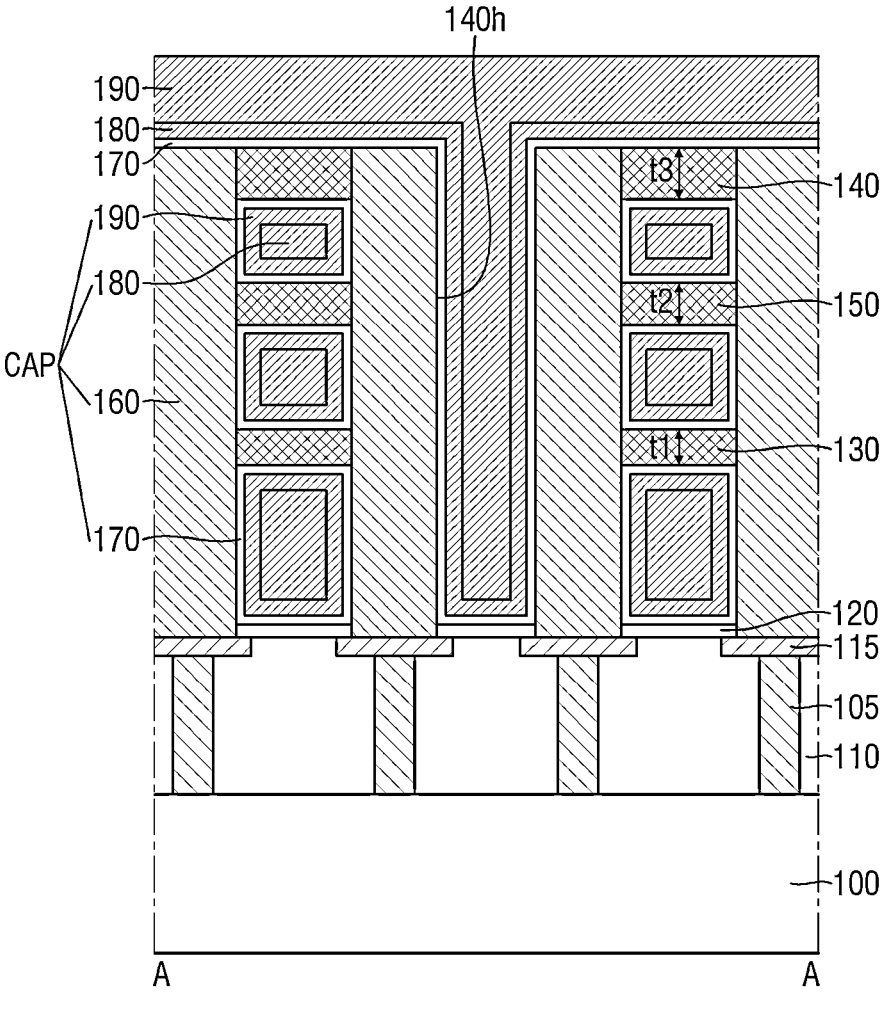
FIG. 9, FIG. 10, and FIG. 13 are cross-sectional views for illustrating semiconductor devices according to some example embodiments, respectively.
Figure 10:
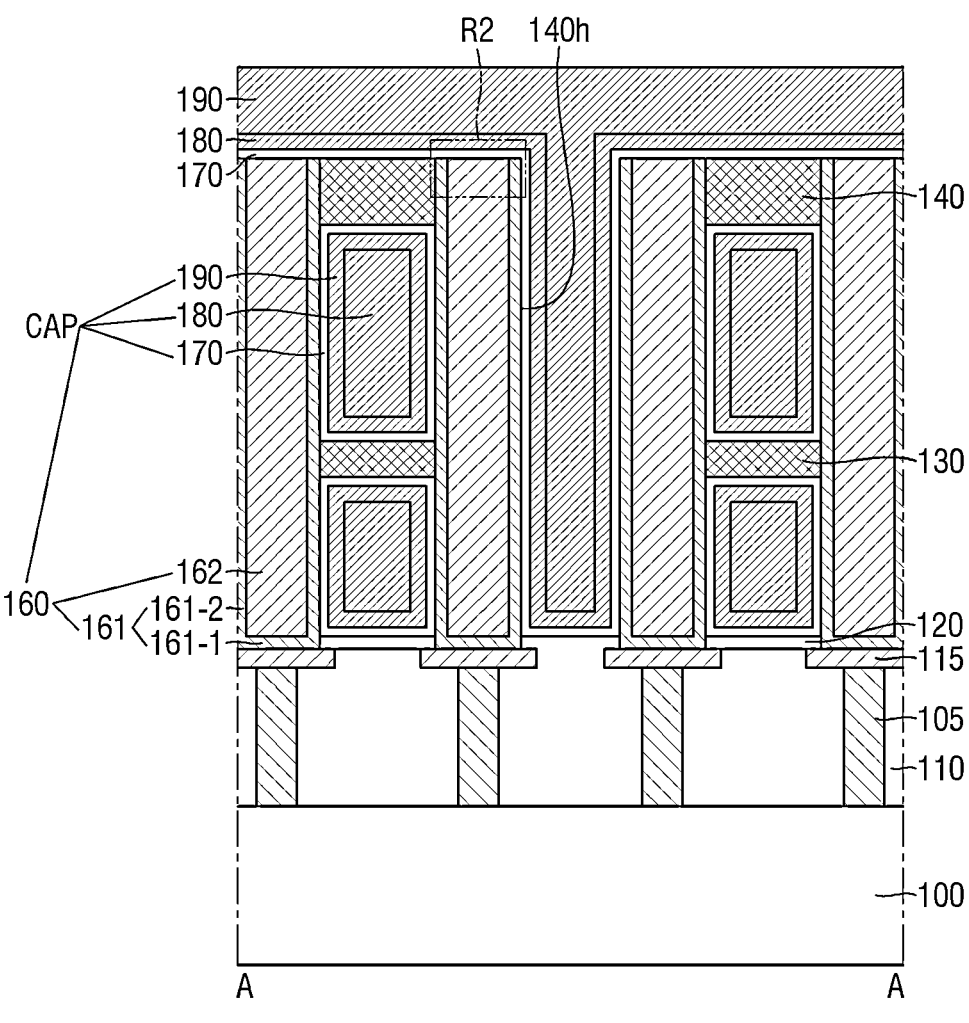
Figure 11:
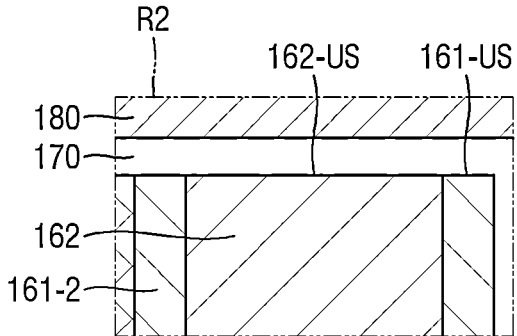
FIG. 11 and FIG. 12 are enlarged views of a R2 area of FIG. 10.
Figure 12:
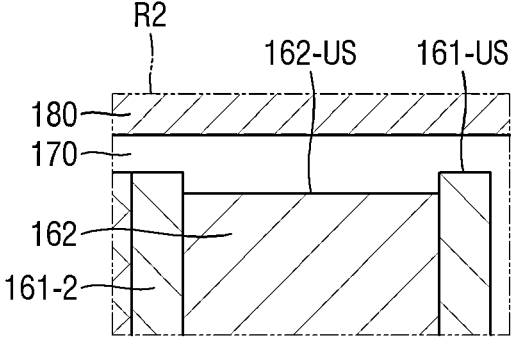
Figure 13:
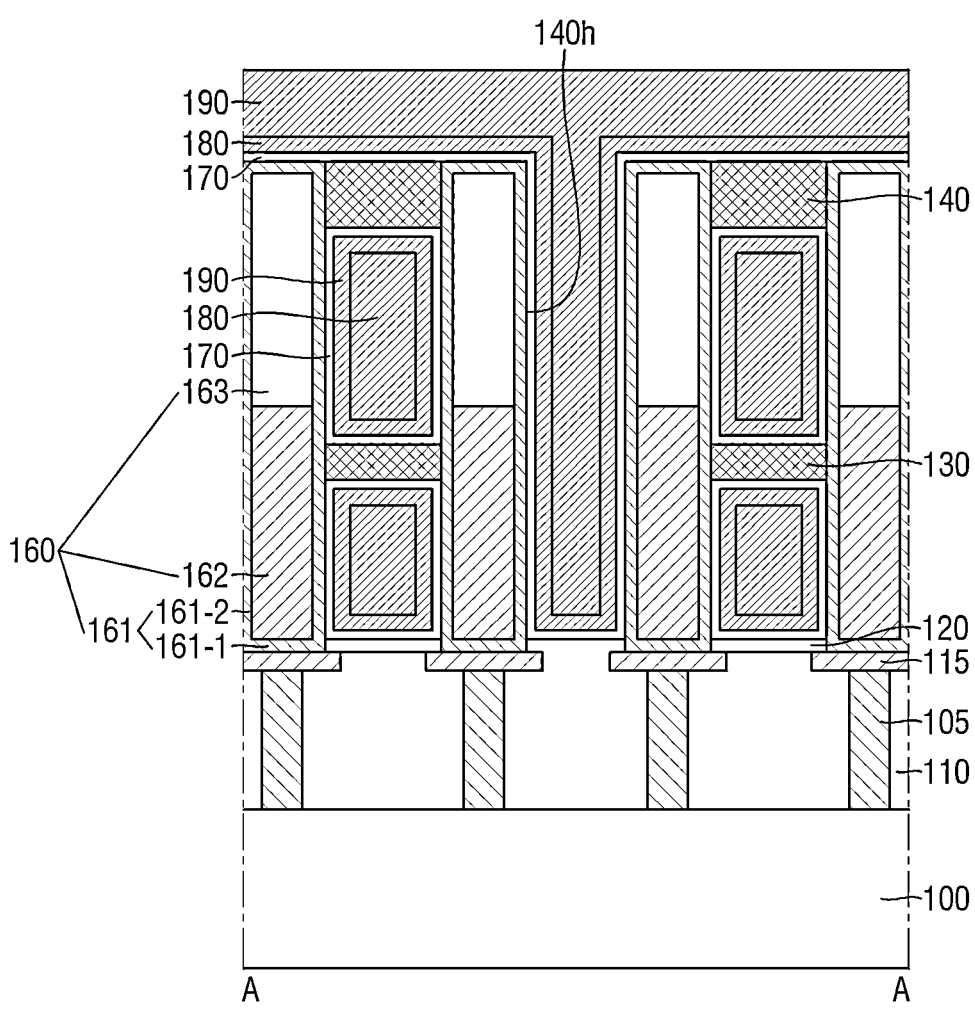

FIG. 9, FIG. 10, and FIG. 13 are cross-sectional views for illustrating semiconductor devices according to some example embodiments, respectively. FIG. 11 and FIG. 12 are enlarged views of a R2 area of FIG. 10. For reference, FIG. 9, FIG. 10, and FIG. 13 are cross-sectional views taken along a line A-A of FIG. 1. For convenience of description, following descriptions are based on differences from those as described above with reference to FIG. 1 to FIG. 8.

Referring to FIG. 9, the semiconductor device according to some example embodiments may further include a third supporter 150.

The third supporter 150 may be disposed between the first supporter 130 and the second supporter 140. In the semiconductor device according to some example embodiments, a thickness t3 in the fifth direction DR5 of the third supporter 150 may be greater than a thickness t2 in the fifth direction DR5 of the second supporter 140.

The third supporter 150 may include a plurality of supporter holes corresponding to the plurality of supporter holes 140$h$ of the second supporter 140. The plurality of supporter holes 140$h$ of the second supporter 140 may be respectively aligned with the plurality of supporter holes of the third supporter 150 in the fifth direction DR5 of the substrate 100. The third supporter 150 may include, for example, at least one of silicon oxynitride (SiON), silicon nitride (SiN), silicon carbon nitride (SiCN), and tantalum oxide (TaO).

Referring to FIG. 10, in the semiconductor device according to some example embodiments, the lower electrode 160 may include a first film 161 and a second film 162 disposed on the first film 161.

The first film 161 may have a cylindrical shape. The first film 161 may include a bottom 161-1 extending along a top face of the first landing pad 115, and a sidewall 161-2 extending from the bottom 161-1 in the fifth direction DR5 of the substrate 100. The first film 161 may define a trench t. The second film 162 may be disposed on the first film 161 so as to fill the trench t.

In the semiconductor device according to some example embodiments, the first film 161 and the second film 162 may include the same material. For example, the first film 161 and the second film 162 may include the same material which may include a doped semiconductor material, a conductive metal nitride, a metal, or a conductive metal oxide. In the semiconductor device according to some example embodiments, the first film 161 and the second film 162 may include titanium nitride (TiN).

In the semiconductor device according to some example embodiments, the first film 161 and the second film 162 may include different materials. For example, the first film 161 may include one of a doped semiconductor material, a conductive metal nitride, a metal, or a conductive metal oxide, while the second film 162 may include one of a doped semiconductor material, a conductive metal nitride, a metal, a conductive metal oxide, or a dielectric material and other than the material of the first film 161. In the semiconductor device according to some example embodiments, the first film 161 may include titanium nitride (TiN), and the second film 162 may include a metal other than titanium nitride or silicon. In the semiconductor device according to some example embodiments, the second film 162 may include the same material as that of the capacitor dielectric film 170.

Referring to FIG. 11, a top face 161-US of the first film 161 may be substantially coplanar with a top face 162-US of the second film 162.

Referring to FIG. 12, a top face of the lower electrode 160 may have a step. A top face 162-US of the second film 162 is positioned below a top face 161-US of the first film 161. The capacitor dielectric film 170 may extend along the top face 162-US of the second film 162 and the top face 161-US of the first film 161. The capacitor dielectric film 170 may fill a gap between the top face 162-US of the second film 162 and the top face 161-US of the first film 161. The upper electrode 180 is not disposed in the trench t.

Referring to FIG. 13, in the semiconductor device according to some example embodiments, the lower electrode 160 may include first to third films 161, 162, and 163. The first film 161 may define the trench t, the second film 162 may be disposed on the first film 161 so as to fill a portion of the trench t, and the third film 163 may be disposed on the second film 162 so as to fill the remainder of the trench t.

The first film 161 may include, for example, one of a doped semiconductor material, a conductive metal nitride, a metal, and a conductive metal oxide. Each of the second and third films 162 and 163 may include, for example, one of a doped semiconductor material, a conductive metal nitride, a metal, a conductive metal oxide, and a dielectric material. In the semiconductor device according to some example embodiments, the first film 161 may include titanium nitride (TiN), the second film 162 may include a metal other than titanium nitride, and the third film 163 may include silicon or the dielectric material. In the semiconductor device according to some example embodiments, the third film 163 may include the same material as that of the capacitor dielectric film 170.

Figure 14:
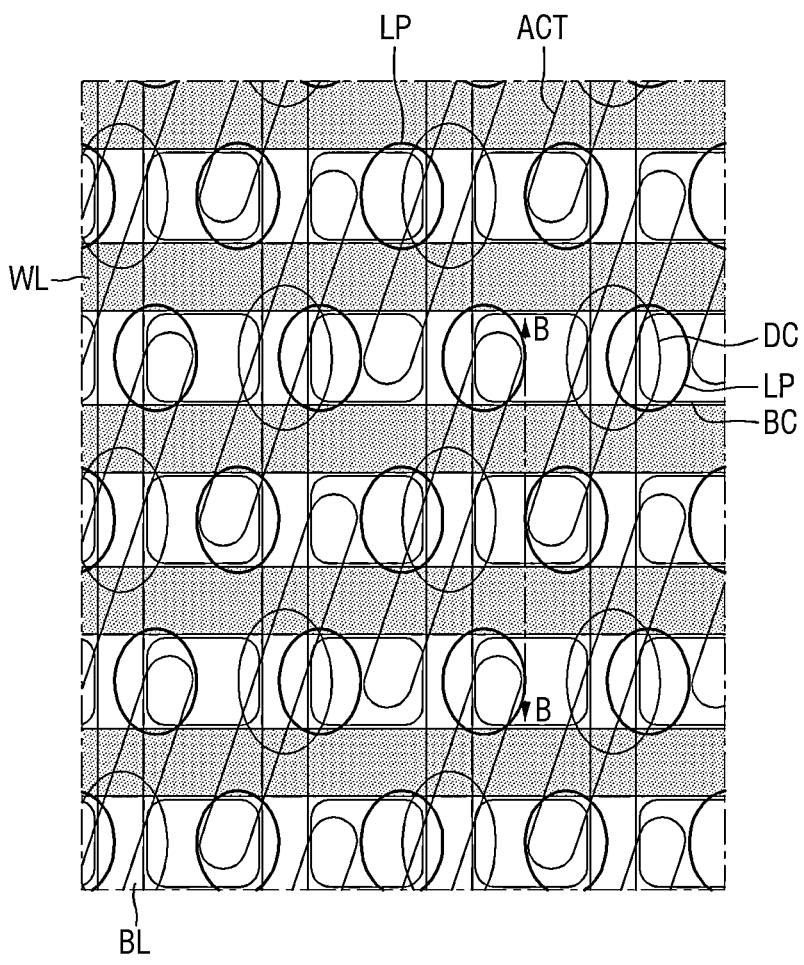
FIGS. 14 and 15 are diagrams for illustrating a semiconductor device according to some example embodiments.
Figure 14:
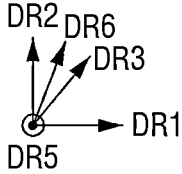
Figure 15:
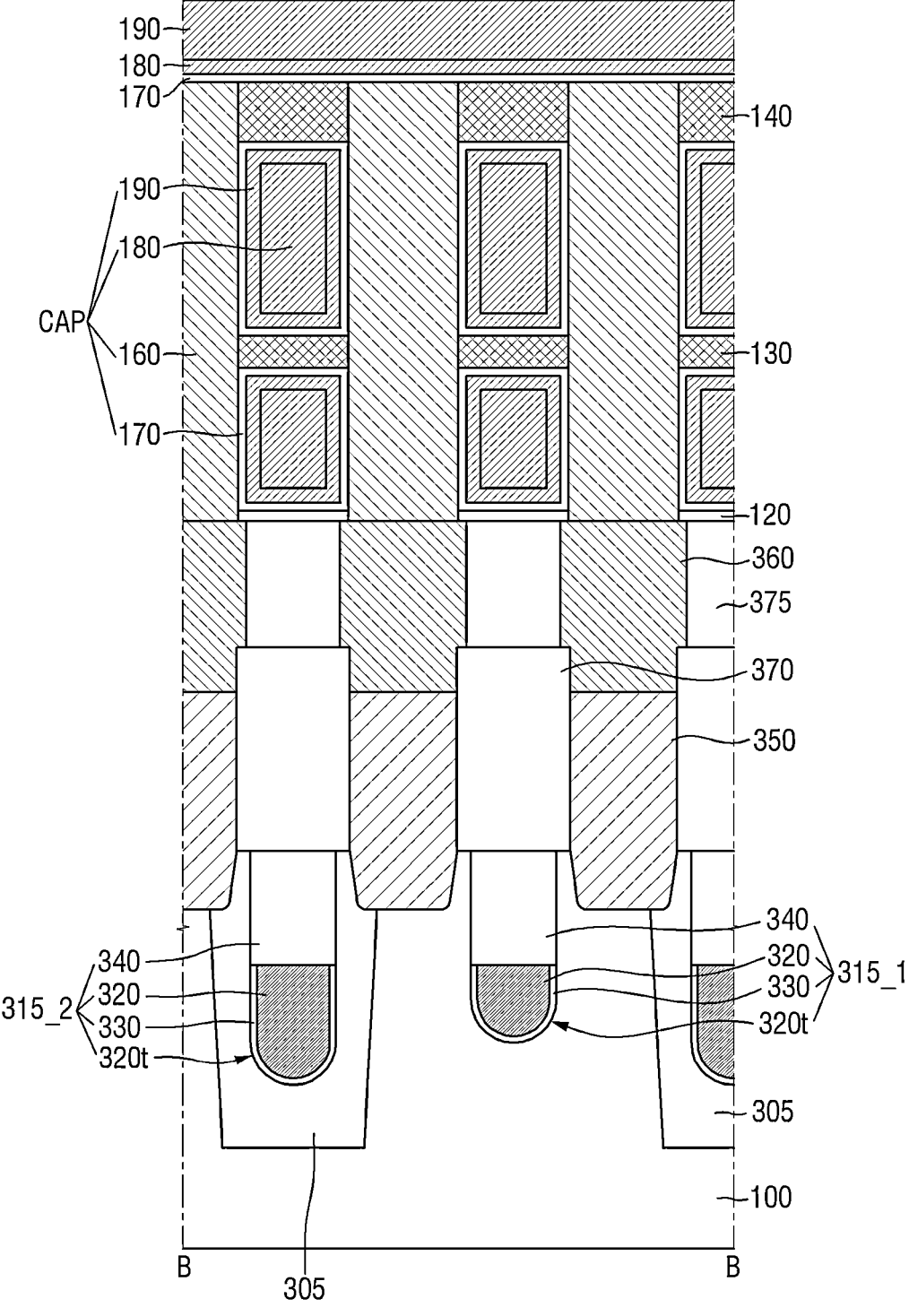

FIGS. 14 and 15 are diagrams for illustrating a semiconductor device according to some example embodiments. For reference, FIG. 15 is a cross-sectional view taken along a line B-B of FIG. 14.

FIG. 14 shows an illustrative layout diagram of a DRAM (Dynamic Random Access Memory) free of the capacitor CAP. However, the present disclosure is not limited thereto. In one example, the first direction DR1 and the second direction DR2 of FIG. 14 may be identical with the first direction DR1 and the second direction DR2 of FIG. 1, respectively. However, the present disclosure is not limited thereto. The first direction DR1 of FIG. 14 may correspond to the second direction DR2 of FIG. 1, and the second direction DR2 of FIG. 14 may correspond to the first direction DR1 of FIG. 1.

Referring to FIG. 14, the semiconductor device according to some example embodiments may include a plurality of active areas ACT. The active area ACT may be defined by an element isolation film (305 in FIG. 15) formed in the substrate (100 in FIG. 15).

As the design rule of the semiconductor device is reduced, the active area ACT may extend in a form of an oblique or diagonal linear bar as shown. The active area ACT may have a bar shape extending in a sixth direction DR6.

A plurality of gate electrodes may be disposed on the active area ACT and may extend in the first direction DR1 across the active area ACT. The plurality of gate electrodes may extend in a parallel (or alternatively, a substantially parallel) manner to each other. The plurality of gate electrodes may act as, for example, a plurality of word-lines WL. The word-lines WL may be arranged so as to be spaced from each other by an equal spacing. A width of the word-line WL or a spacing between the word-lines WL may be determined according to the design rule. A plurality of bit-lines BL extending in the second direction DR2 orthogonal to the extension direction of the word-line WL may be disposed on the word-lines WL. The plurality of bit-lines BL may extend in a parallel (or alternatively, a substantially parallel) manner to each other. The bit-lines BL may be arranged so as to be spaced from each other by an equal spacing. A width of the bit-line BL or a spacing between the bit-lines BL may be determined according to the design rule.

The semiconductor device according to some example embodiments may include various contact arrangements formed on the active area ACT. The various contact arrangements may include, for example, a direct contact DC, a buried contact BC, and a landing pad LP, and the like. In this regard, the direct contact DC may mean a contact that electrically connects the active area ACT to the bit-line BL. The buried contact BC may mean a contact connecting the active area ACT to the lower electrode (160 of FIG. 15) of the capacitor (CAP of FIG. 15).

In a layout structure, a contact area between the buried contact BC and the active area ACT may be small. Accordingly, a conductive second landing pad LP may be introduced to expand the contact area between the active area ACT and the buried contact BC, and to expand the contact area between the buried contact BC and the lower electrode (160 in FIG. 15) of the capacitor. The second landing pad LP may be disposed between the active area ACT and the buried contact BC, and between the buried contact BC and the lower electrode of the capacitor. In the semiconductor device according to some example embodiments, the second landing pad LP may be disposed between the buried contact BC and the lower electrode of the capacitor. The contact area may increase via the introduction of the landing pad LP, such that a contact resistance between the active area ACT and the capacitor lower electrode may be reduced.

In the semiconductor device according to some example embodiments, the direct contact DC may be disposed on a middle portion of the active area ACT. The buried contact BC may be disposed at each of both opposing ends of the active area ACT. As the buried contact BC is disposed at each of both opposing ends of the active area ACT, the second landing pad LP may be disposed adjacent to each of both opposing ends of the active area ACT and may partially overlap the buried contact BC. In other words, the buried contact BC may be formed to overlap the active area ACT and the element isolation film (305 in FIG. 21) between adjacent word-lines WL and between adjacent bit-lines BL.

The word-line WL may be formed as a structure buried in the substrate 100. The word-line WL may extend across the active area ACT between the direct contacts DC or between the buried contacts BC.

As shown, two word-lines WL may extend through one active area ACT. As the active area ACT extends along in the diagonal manner, the extension direction of the word-line WL may have an angle smaller than 90 degrees with respective to the extension direction of the active area ACT.

The direct contacts DC and the buried contacts BC may be arranged in a symmetrical manner. Thus, the direct contacts DC may be arranged along the first direction DR1 and the second direction DR2. The buried contacts BC may be arranged along the first direction DR1 and the second direction DR2. In one example, unlike the direct contact DC and the buried contact BC, the second landing pads LP may be arranged in a zigzag manner in the second direction DR2 in which the bit-line BL extends. Further, the second landing pads LP may overlap with the same portion of a side face of each bit-line BL in the first direction DR1 in which the word-line WL extends. For example, each of (or alternatively, at least one of) the second landing pads LP in a first line may overlap a left side face of a corresponding bit-line BL, while each of (or alternatively, at least one of) the second landing pads LP in a second line may overlap with a right side face of the corresponding bit-line BL.

Referring to FIG. 14 and FIG. 15, the semiconductor device according to some example embodiments may include gate structures 315_1 and 315_2, a second storage contact 350, and a capacitor CAP.

The element isolation film 305 may be formed in the substrate 100. The element isolation film 305 may have an STI (shallow trench isolation) structure having excellent element isolation characteristics. The element isolation film 305 may define an active area ACT in the substrate 100.

The gate structures 315_1 and 315_2 may be formed in the substrate 100 and in the element isolation film 305. The gate structures 315_1 and 315_2 may extend across the element isolation film 305 and the active area ACT defined by the element isolation film 305. The gate structures 315_1 and 315_2 include the gate structure 315_1 in the active area ACT of the substrate 100 and the gate structure 315_2 in the element isolation film 305. Each of the gate structures 315_1 and 315_2 may include a buried gate trench 320*t* formed in each of the substrate 100 and the element isolation film 305, a gate insulating film 330, a gate electrode 320, and a gate block pattern 340. The gate electrode 320 may act as the word-line WL. For example, a depth of the buried gate trench 320*t* formed in the substrate 100 may be different from a depth of the buried gate trench 320*t* formed in the element isolation film 305.

The gate insulating film 330 may extend along a sidewall and a bottom face of the buried gate trench 320*t*. The gate insulating film 330 may extend along a profile of at least a portion of the buried gate trench 320*t*. The gate insulating film 330 may include, for example, at least one of a high-k material including silicon oxide, silicon oxynitride, silicon nitride, or metal.

The gate electrode 320 may be formed on the gate insulating film 330. The gate electrode 320 may fill a portion of the buried gate trench 320*t*.

The gate electrode 320 may include, for example, at least one of a semiconductor material doped with impurities, a conductive silicide compound, a conductive metal nitride, a conductive metal oxide, a conductive metal oxynitride, and a metal. The gate electrode 320 may include, for example, at least one of Titanium Nitride (TiN), Tantalum Carbide (TaC), Tantalum Nitride (TaN), Titanium Silicon Nitride (TiSiN), Tantalum Silicon Nitride (TaSiN), Tantalum Titanium Nitride (TaTiN), Titanium Aluminum Nitride (TiAlN), Tantalum Aluminum Nitride (TaAlN), Tungsten Nitride (WN), Ruthenium Ru, Titanium Aluminum TiAl, Titanium Aluminum Carbide Nitride (TiAlC—N), Titanium Aluminum Carbide (TiAlC), Titanium Carbide (TiC), Tantalum Carbon Nitride (TaCN), Tungsten (W), Aluminum (Al), Copper (Cu), Cobalt (Co), Titanium (Ti), Tantalum (Ta), Nickel (Ni), Platinum (Pt), Nickel Platinum (Ni—Pt), Niobium (Nb), Niobium Nitride (NbN), Niobium Carbide (NbC), Molybdenum (Mo), Molybdenum Nitride (MoN), Molybdenum Carbide (MoC), Tungsten Carbide (WC), Rhodium (Rh), Palladium (Pd), Iridium (Ir), Silver (Ag), Gold (Au), Zinc (Zn), Vanadium (V), Ruthenium Titanium Nitride (RuTiN), Titanium Silicide (TiSi), Tantalum Silicide (TaSi), Nickel Silicide (NiSi), Cobalt Silicide (CoSi), Iridium Oxide (IrO), Ruthenium Oxide (RuO) and combinations thereof. However, the present disclosure is not limited thereto.

The gate block pattern 340 may be formed on the gate electrode 320. The gate block pattern 340 may fill the remaining portion of the buried gate trench 320*t* other than a portion thereof in which the gate electrode 320 is disposed. The gate block pattern 340 may include, for example, at least one of silicon nitride, silicon oxynitride, silicon oxide, silicon carbonitride, silicon oxycarbonitride, and combinations thereof.

A third lower interlayer insulating film 370 may be disposed on the substrate 100 and the element isolation film 305. The third lower interlayer insulating film 370 may cover the gate structures 315_1 and 315_2.

The second storage contact 350 may be formed in the third lower interlayer insulating film 370. The second storage contact 350 may be connected to the substrate 100. More specifically, the second storage contact 350 may be connected to a source/drain area formed in the active area ACT of the substrate 100. The second storage contact 350 may be disposed on at least one side of each of the gate structures 315_1 and 315_2. For example, the second storage contact 350 may be disposed on each of both opposing sides of the gate structures 315_1 and 315_2. The second storage contact 350 may act as the buried contact BC. Further, the second storage contact 350 may act as the first storage contact 105 in FIG. 3 and FIG. 4.

A storage pad 360 may be formed on the second storage contact 350. The storage pad 360 may be electrically connected to the second storage contact 350. In this regard, the storage pad 360 may act as the second landing pad LP. Further, the storage pad 360 may act as the first landing pad 115 in FIG. 2.

A third upper interlayer insulating film 375 may be formed on the third lower interlayer insulating film 370. The third upper interlayer insulating film 375 may cover the storage pad 360. The third upper interlayer insulating film 375 and the third lower interlayer insulating film 370 may act as the first interlayer insulating film 110 in FIG. 2. The first etch stop film 120 may be formed on the third upper interlayer insulating film 375 and the storage pad 360.

The capacitor CAP may be disposed on the storage pad 360. The capacitor CAP may be connected to the storage pad 360. That is, the capacitor CAP may be electrically connected to the second storage contact 350.

The capacitor CAP may include the lower electrode 160, the capacitor dielectric film 170, the upper electrode 180, and the upper plate electrode 190. The first supporter 130 and the second supporter 140 may be formed on the first etch stop film 120.

Descriptions of the lower electrode 160, the capacitor dielectric film 170, the upper electrode 180, the upper plate electrode 190, the first supporter 130, and the second supporter 140 included in the capacitor CAP may be substantially the same as those as set forth above with reference to FIG. 1 to FIG. 13.

Figure 16:
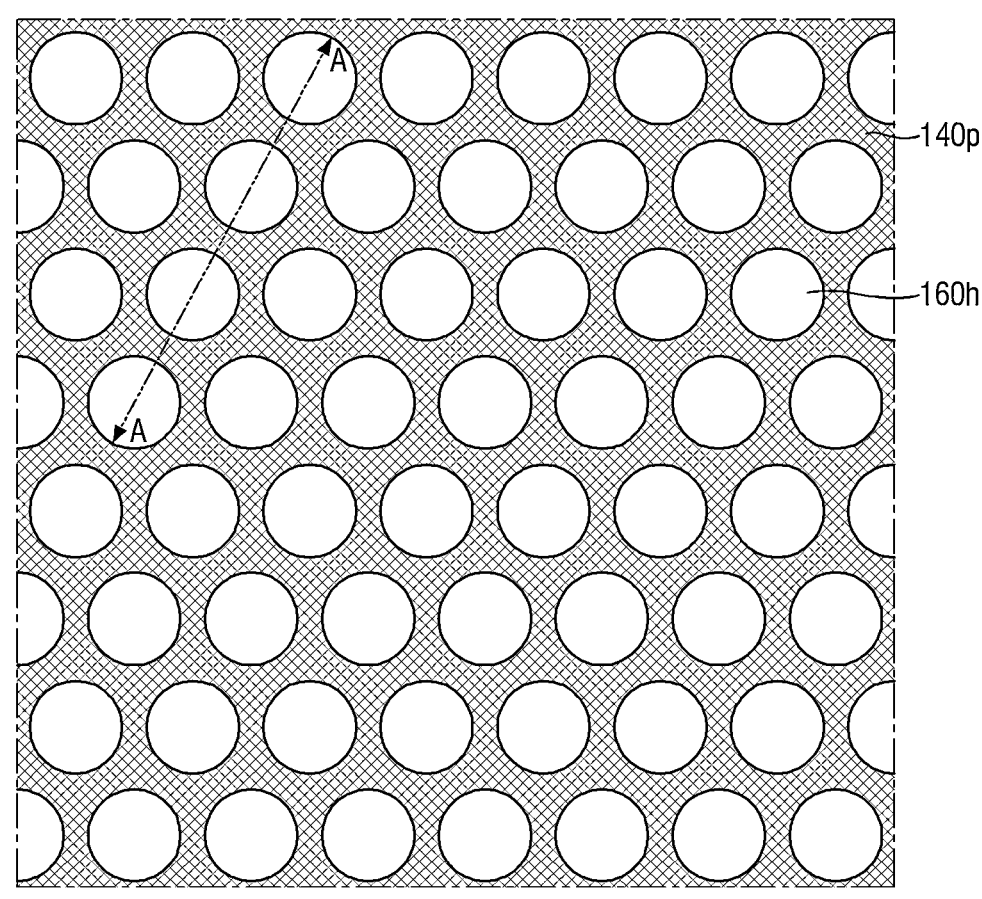
FIG. 16 to FIG. 23 are diagrams of intermediate structures corresponding to steps for illustrating a method for manufacturing a semiconductor device according to some example embodiments.
Figure 16:
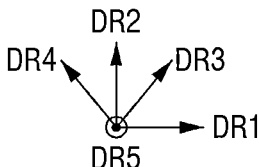
Figure 17:
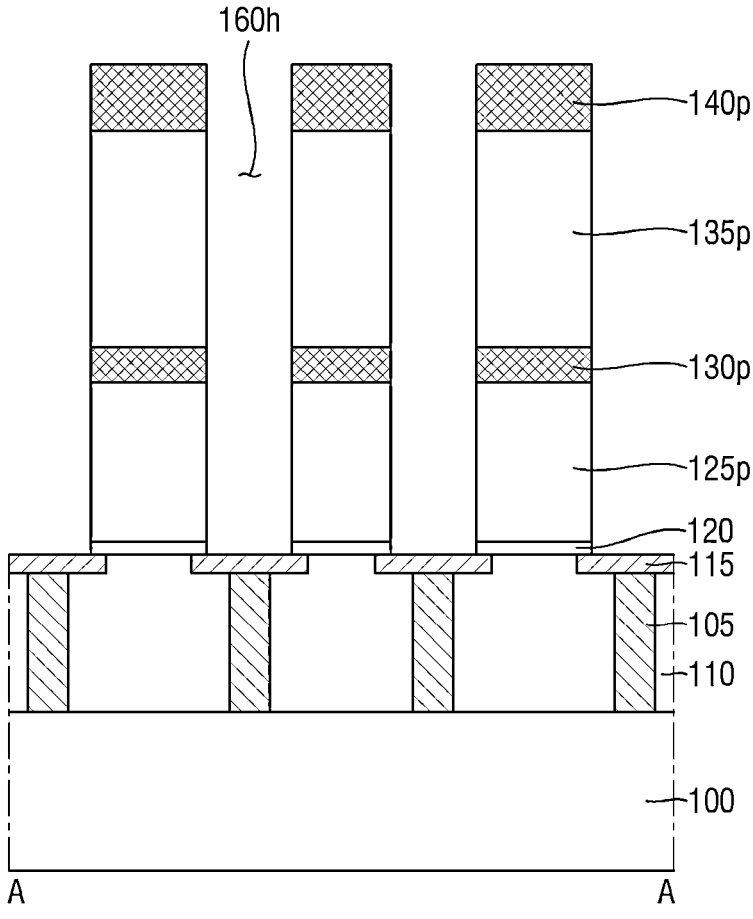
Figure 18:
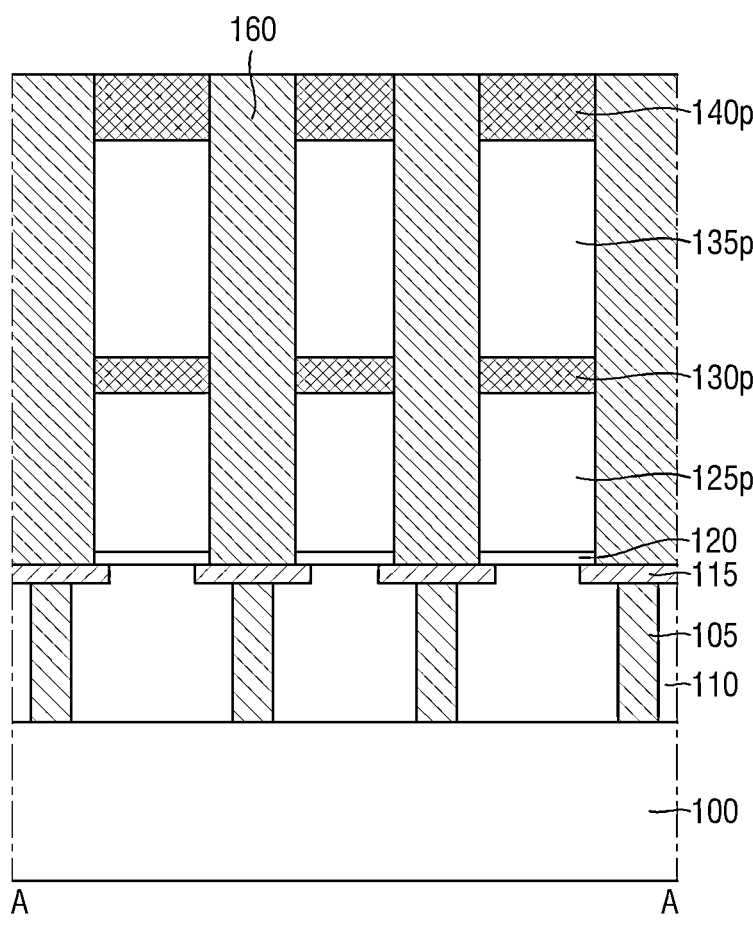
Figure 19:
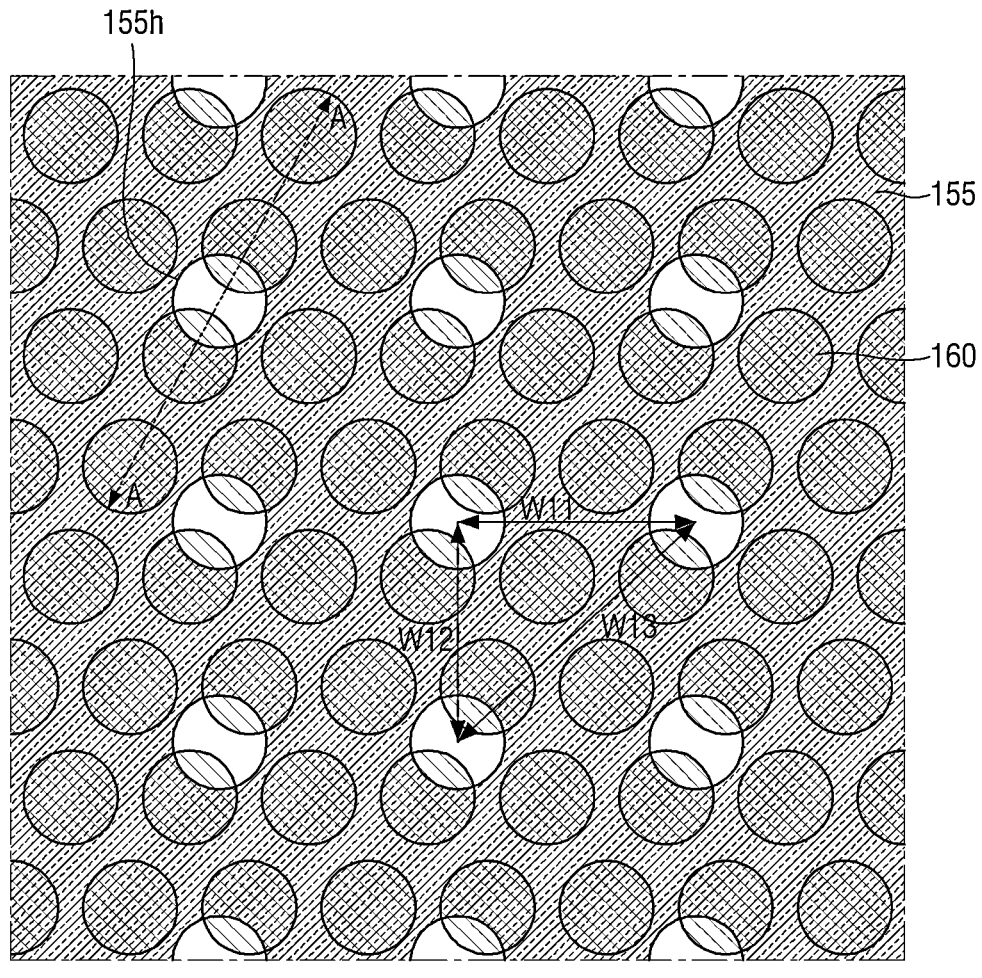
Figure 19:
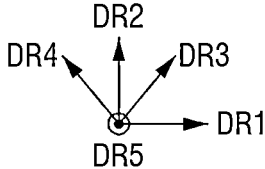
Figure 20:
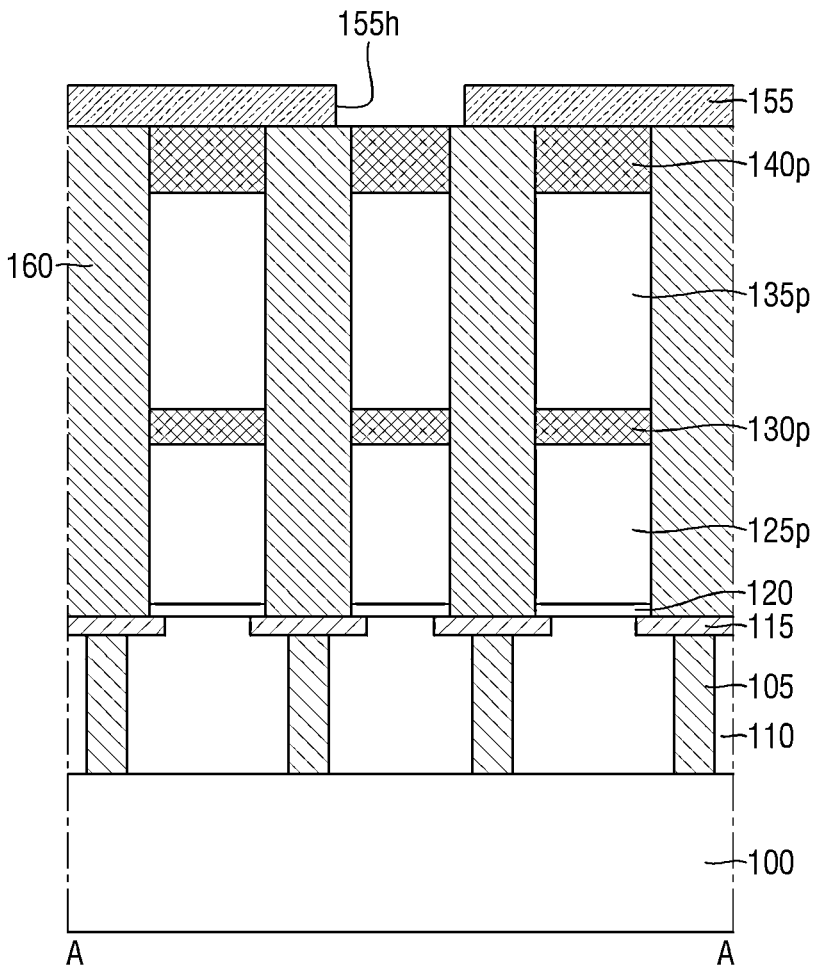
Figure 21:
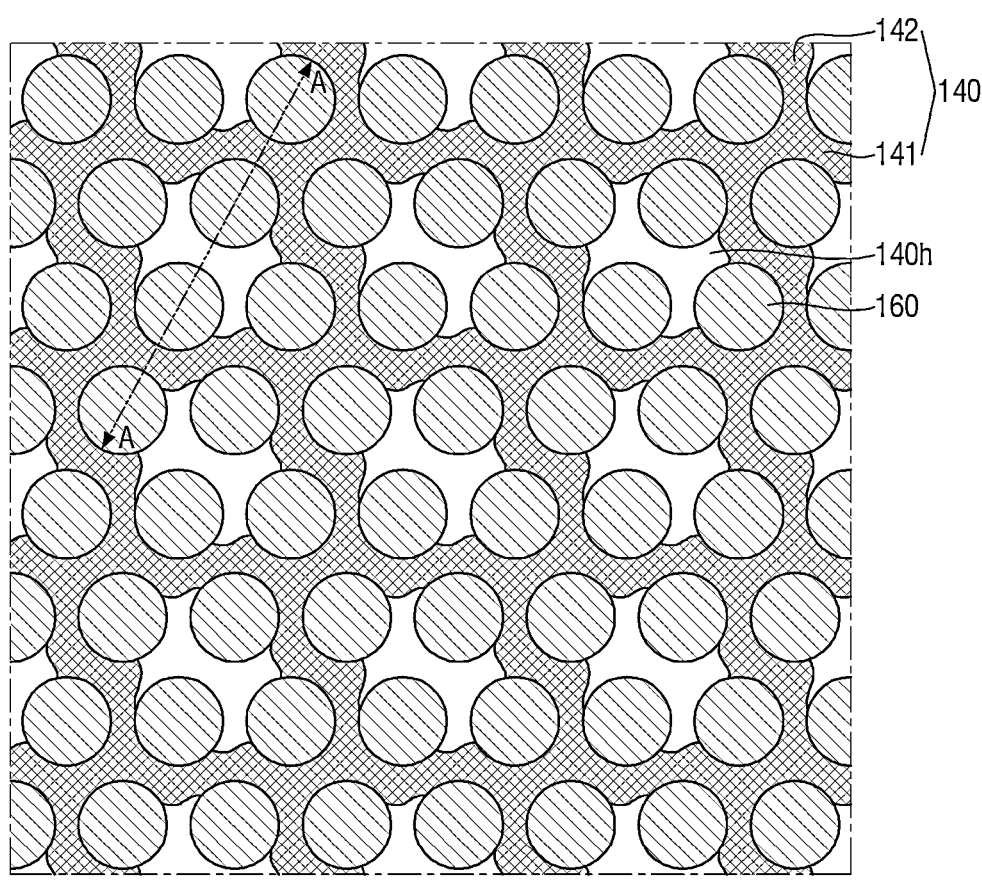
Figure 21:
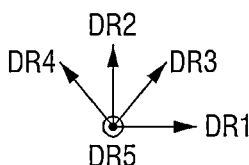
Figure 22:
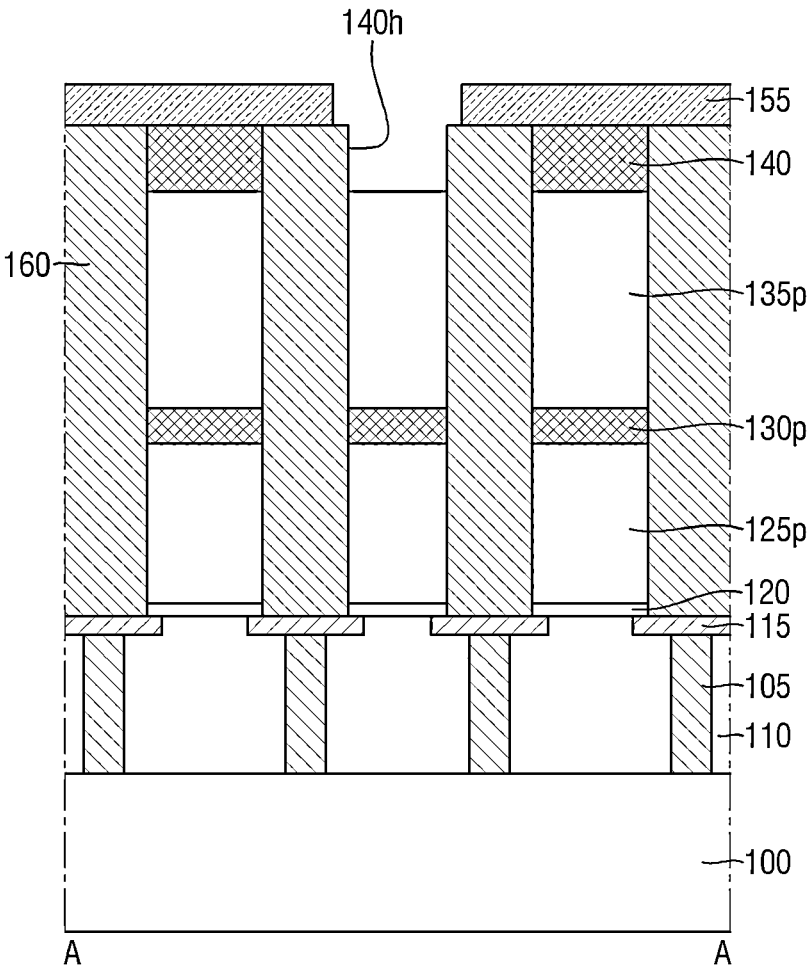
Figure 23:
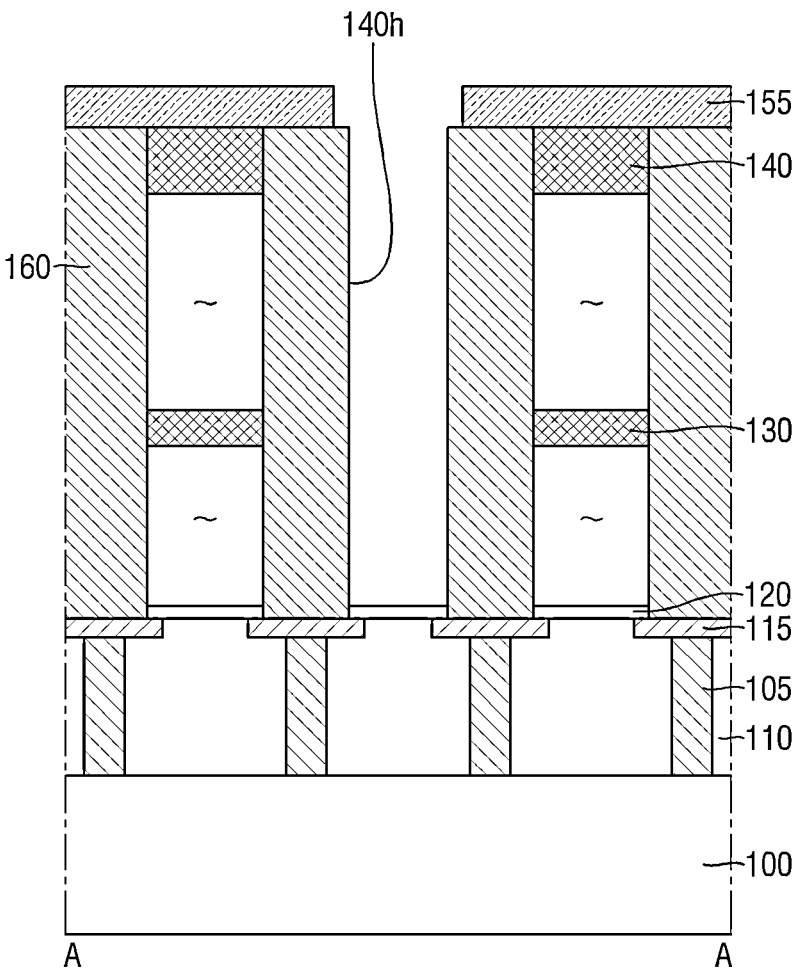

FIG. 16 to FIG. 23 are diagrams of intermediate structures corresponding to steps for illustrating a method for manufacturing a semiconductor device according to some example embodiments. For reference, FIG. 16, FIG. 19, and FIG. 21 are plan views of intermediate structures corresponding to steps of the method. FIG. 17 and FIG. 18 are cross-sectional views taken along a line A-A of FIG. 16, FIG. 20 is a cross-sectional view taken along a line A-A of FIG. 19, and FIG. 22 and FIG. 23 are cross-sectional views taken along a line A-A of FIG. 21.

Referring to FIG. 16 and FIG. 17, a first mold film 125p, a first pre-supporter film 130p, a second mold film 135p, and a second pre-supporter film 140p sequentially disposed on the substrate 100 may be formed.

Subsequently, a lower electrode hole 160h exposing the first landing pad 115 may be formed. The lower electrode hole 160h may have a constant horizontal width. In another example embodiment, the lower electrode hole 160h may have a tapered shape in which the horizontal width becomes smaller as the hole 160h extends in a direction from a top to a bottom thereof.

Referring to FIG. 18, the lower electrode 160 may be formed on the lower electrode hole 160h. The lower electrode 160 may fill the lower electrode hole 160h. The lower electrode 160 may be formed using a process such as chemical vapor deposition (CVD), atomic layer deposition (ALD) or PEALD (plasma enhanced ALD).

Referring to FIG. 19 and FIG. 20, a mask pattern 155 may be formed on the second pre-supporter film 140p and the lower electrode 14.

The mask pattern 155 may have a mask hole 155h defined therein. The mask holes 155h may be arranged so as to be spaced apart from each other by a predetermined (or alternatively, a desired) spacing along each of the first and second directions DR1 and DR2. The mask holes 155h may be arranged in a lattice structure. The mask hole 155h may be disposed between the four lower electrodes 160 adjacent to each other around a center of the mask hole 155h. The mask hole 155h may be disposed between the lower electrodes 160 adjacent to each other in the third direction DR3 or the fourth direction DR4.

The mask hole 155h may expose a portion of the lower electrode 160. For example, the mask hole 155h may expose a portion of each of (or alternatively, at least one of) the two lower electrodes 160. The mask hole 155h may expose a portion of each of the lower electrodes 160 adjacent to each other in the third direction DR3 or the fourth direction DR4.

The mask holes 155h may be spaced apart from each other by a first distance W11 in the first direction DR1, from each other by a second distance W12 in the second direction DR2, and from each other by a third distance W13 in the third direction DR3. For example, the first distance W11 may be 6.0 F, the second distance W12 may be 5.2 F, and the third distance W13 may be 7.94 F. In this regard, F may mean a minimum or other unit lithographic feature size.

In some example embodiments, the mask hole 155h may be circular. The mask hole 155h may be disposed between the lower electrodes 160.

Referring to FIG. 21 and FIG. 22, the second pre-supporter film 140p may partially etched using the mask pattern 155 to form the second supporter 140. The second supporter 140 may be formed by, for example, a dry etching process.

At this time, the lower electrode 160 having an etch selectivity relative to the second pre-supporter film 140p may not be etched. However, the present disclosure is not limited thereto, and in some further example embodiments, a portion of the lower electrode 160 may be etched. A portion of the second mold film 135p may be exposed through a space obtained by partially etching the second supporter 140.

The second supporter 140 may have the support holes 140h defined therein. The second supporter hole 140h may be formed at a position corresponding to the mask hole 155h. The support hole 140h may expose at least a portion of each of the four lower electrodes adjacent to each other.

Referring to FIG. 23, the exposed portion of the second mold film 135p may be removed. The second mold film 135p may be partially removed to expose a portion of a sidewall of the lower electrode 160. The second mold film 135p may be removed by, for example, a wet etching process.

Subsequently, an exposed portion of the first pre-supporter layer 130p may be patterned using the mask pattern 155. Thus, the first supporter 130 may be formed. The first supporter 130 may include a plurality of holes defined therein at positions corresponding to the supporter holes 140h of the second supporter 140.

Subsequently, an exposed portion of the first mold film 125p may be removed to expose another portion of the sidewall of the lower electrode 160. After the first mold film 125p has been partially removed, the mask pattern 155 may be removed.

Referring to FIG. 2, the capacitor dielectric film 170 and the upper electrode 180 may be sequentially formed on the exposed sidewall and the exposed top face of the lower electrode 160. The capacitor dielectric film 170 and the upper electrode 180 are sequentially formed on a top face of the second supporter. The upper plate electrode 190 may be formed on the upper electrode 180. While the upper plate electrode 190 is being formed, a portion of the upper electrode 180 may be removed such that a remaining portion thereof corresponds to a size of the upper plate electrode 190.

Figure 24:
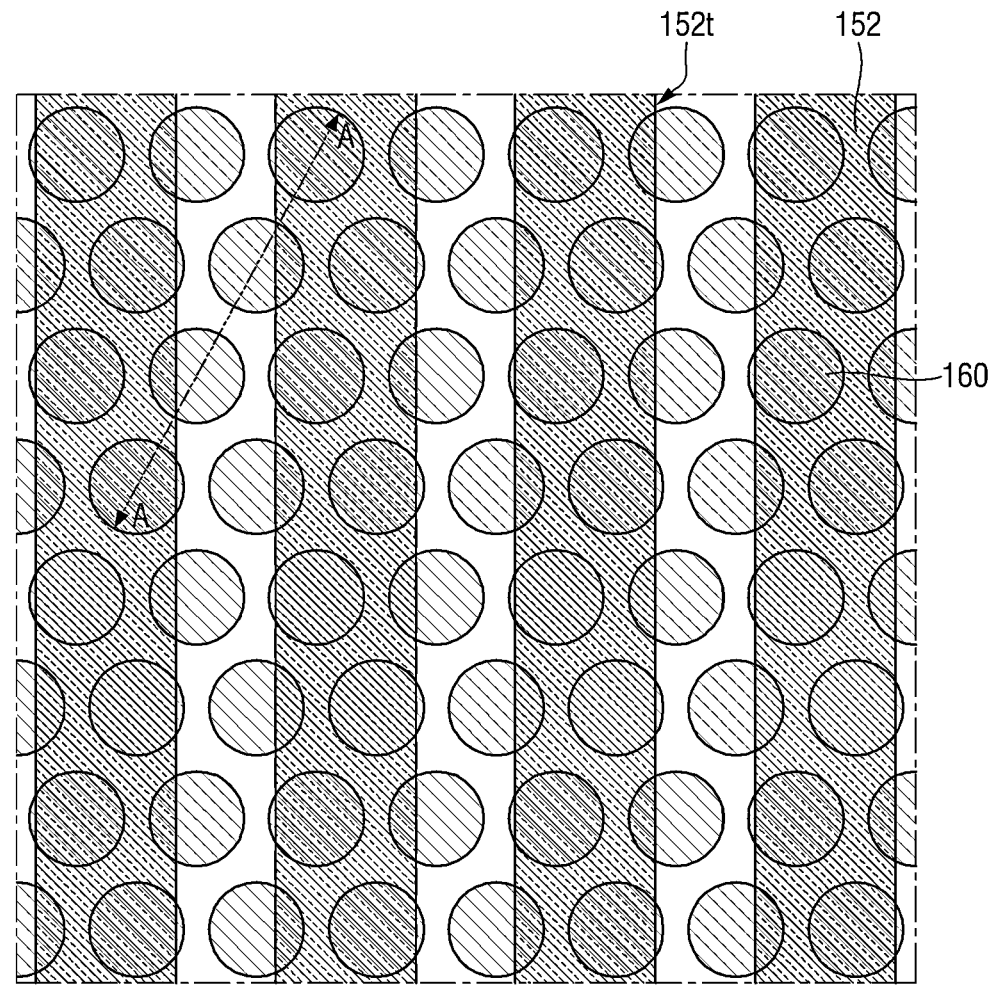
FIG. 24 to FIG. 27 are diagrams of intermediate structures corresponding to steps for illustrating a method for manufacturing a semiconductor device according to some example embodiments.
Figure 24:
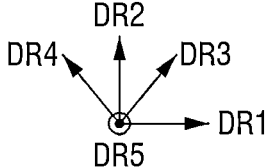
Figure 25:
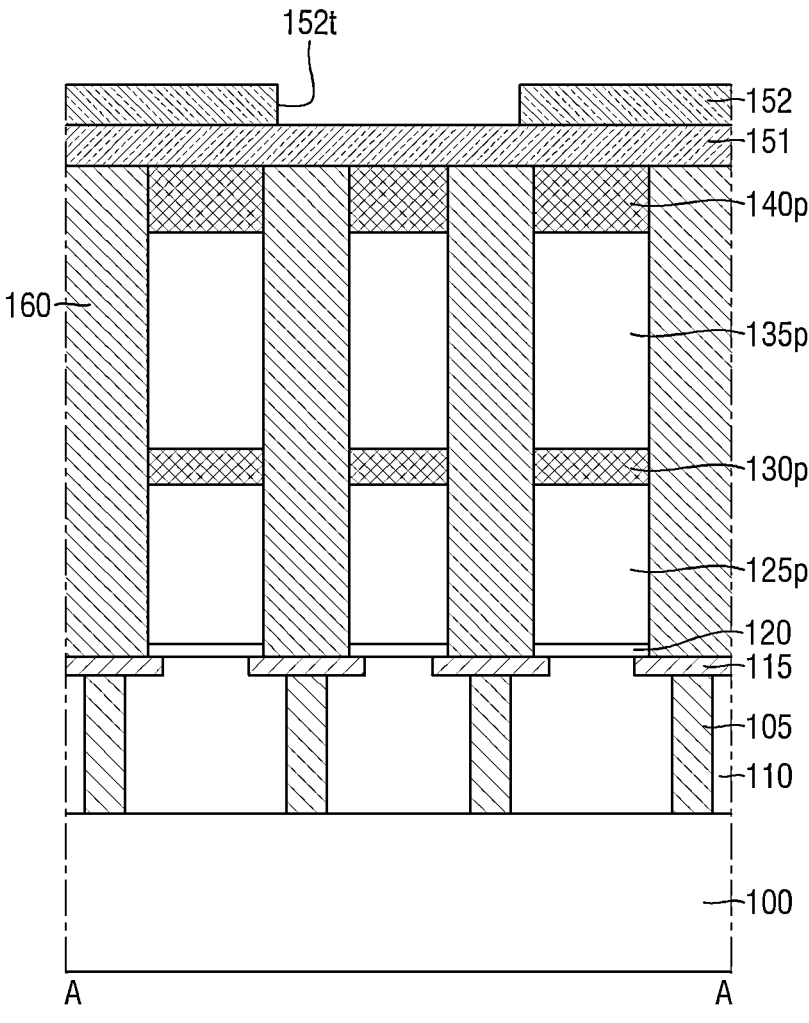
Figure 26:
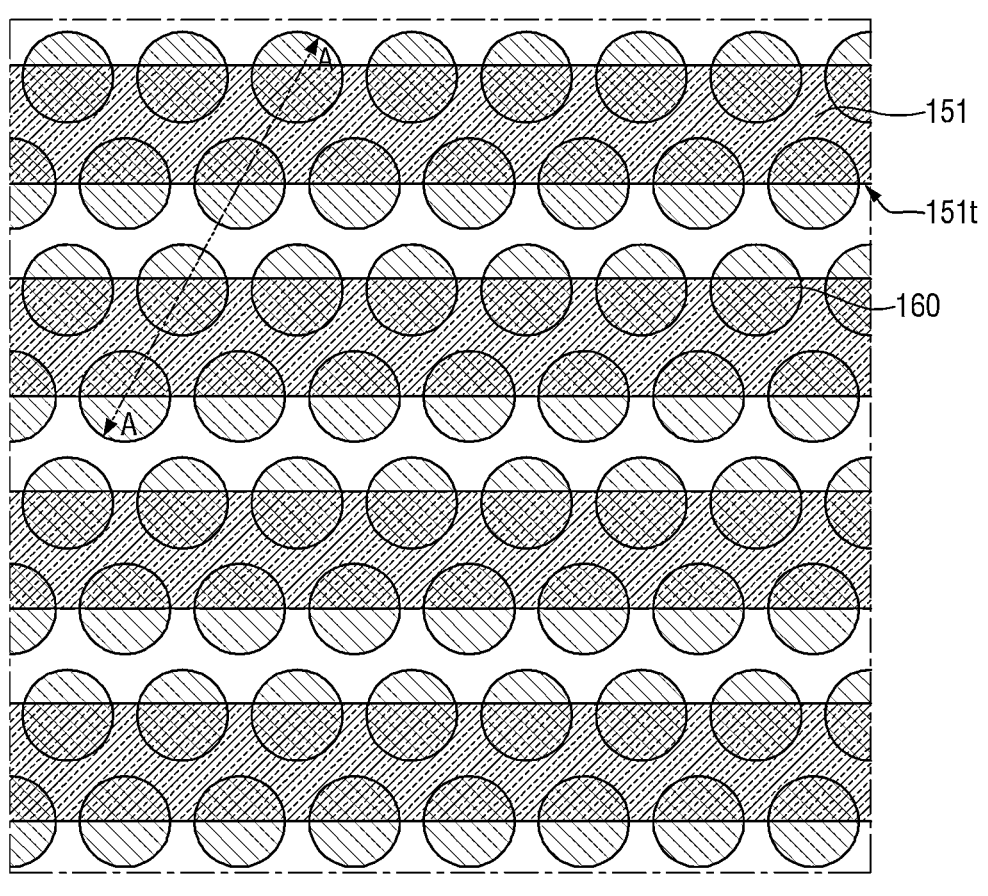
Figure 26:
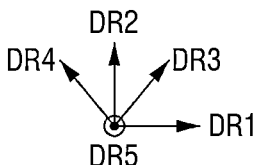
Figure 27:
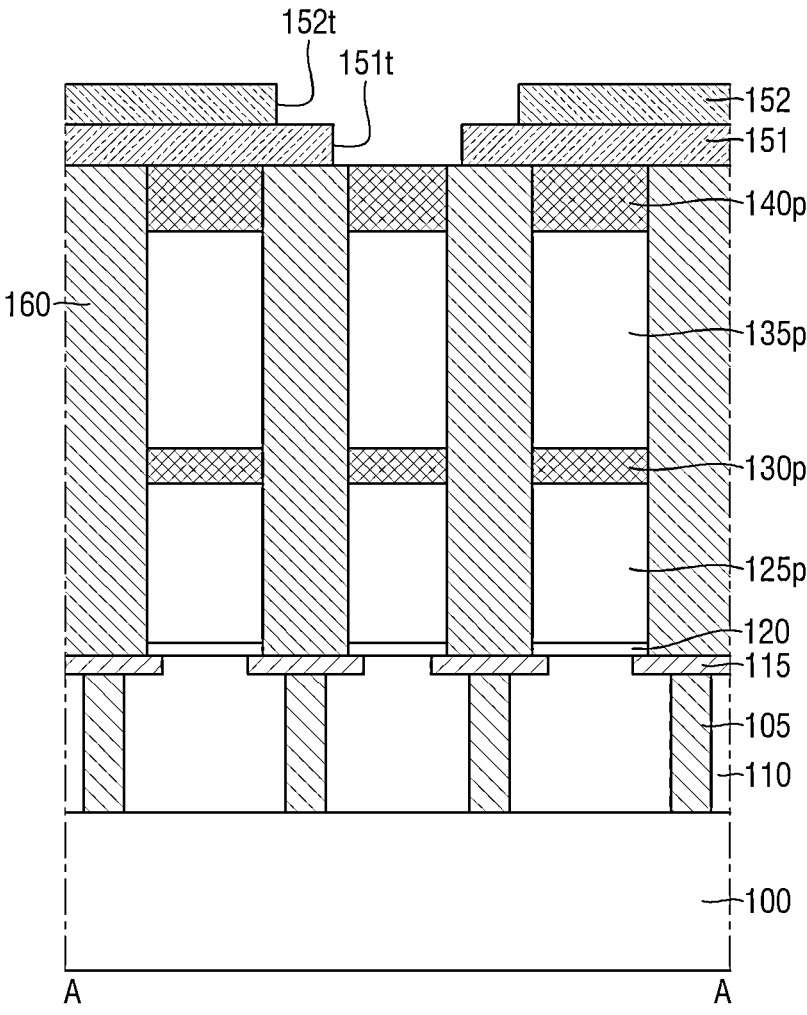

FIG. 24 to FIG. 27 are diagrams of intermediate structures corresponding to steps for illustrating a method for manufacturing a semiconductor device according to some example embodiments. FIG. 24 may relate to a process proceeding after FIGS. 16 to 18. For reference, FIG. 25 is a cross-sectional view taken along a line A-A of FIG. 24, and FIG. 27 is a cross-sectional view taken along a line A-A of FIG. 26.

Referring to FIG. 24 and FIG. 25, a first mask pattern 151 and a second mask pattern 152 may be sequentially formed on the second pre-supporter film 140p and the lower electrode 14. The second mask pattern 152 may be formed on the first mask pattern 151.

The second mask pattern 152 may be partially etched to form a first trench 152t defined therein. The first trench 152t may extend in the second direction DR2. The first trenches 152t may be arranged in the first direction DR1. The first mask pattern 151 may be partially exposed through the first trench 152t. That is, in an area where the first trench 152t is formed, the first mask pattern 151 constitutes a topmost portion in the fifth direction DR5, while in an area where the first trench 152t is not formed, the second mask pattern 152 constitutes a topmost portion in the fifth direction DR5.

Referring to FIG. 26 and FIG. 27, a second trench 151t may be formed in a resulting structure of FIG. 24 and FIG. 25. An area where the first trench 152t is formed includes an area in which the second trench 151t is formed in the first mask pattern 151 and an area in which the second trench 151t is not formed in the first mask pattern 151. FIG. 26 is a view showing the first mask pattern 151 and the second trench 151t to illustrate a shape of the second trench 151t. In an area where the first trench 152t is formed in an area where the first mask pattern 151 is disposed, the first mask pattern 151 constitutes a topmost portion in the fifth direction DR5. In an area in which the first trench 152t is not formed in the area in which the first mask pattern 151 is disposed, the second mask pattern 152 constitutes a topmost portion in the fifth direction DR5.

The second trench 151t may extend in the first direction DR1. The second trenches 151t may be arranged in the second direction DR2. In an area where the first trench 151t and the second trench 152t overlap each other, the second pre-supporter layer 140p may be exposed. That is, a point where the first trench 152t and the second trench 151t intersect each other may correspond to the mask hole 155h of FIG. 19.

A portion of the second pre-supporter layer 140p exposed through the first trench 152t and the second trench 151t may be removed using the first and second mask patterns 151 and 152. The first and second mask patterns 151 and 152 may be removed. Accordingly, the support hole 140h as shown in FIG. 21 may be formed. Subsequently, the manufacturing process as shown in FIG. 23 may be performed.

Alternatively, trenches extending in the first direction DR1 and arranged in the second direction DR2 may be defined in the second mask pattern 152, and then trenches extending in the second direction DR2 and arranged in the first direction DR1 may be defined in the first mask pattern 151.

Figure 28:
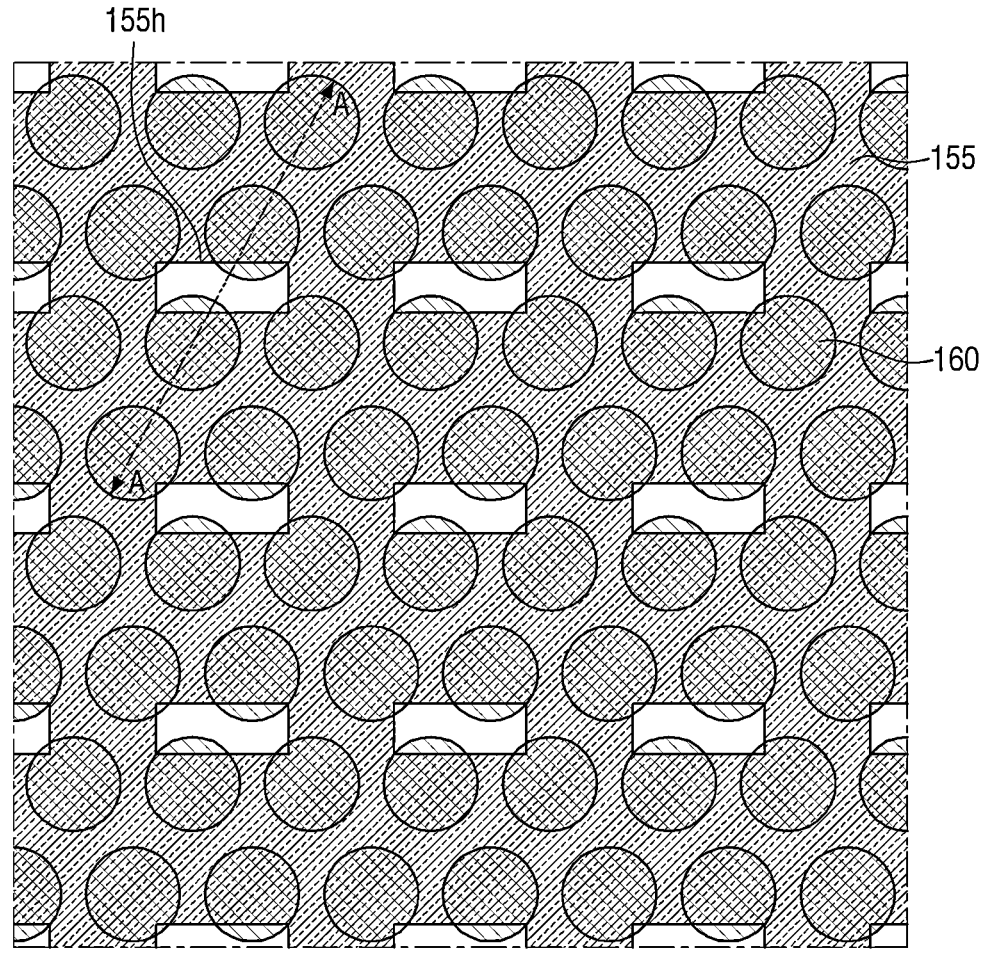
FIG. 28 and FIG. 29 are diagrams for illustrating mask patterns according to some example embodiments, respectively.
Figure 28:
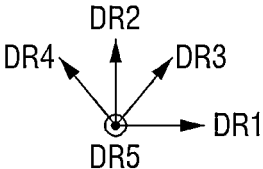
Figure 29:
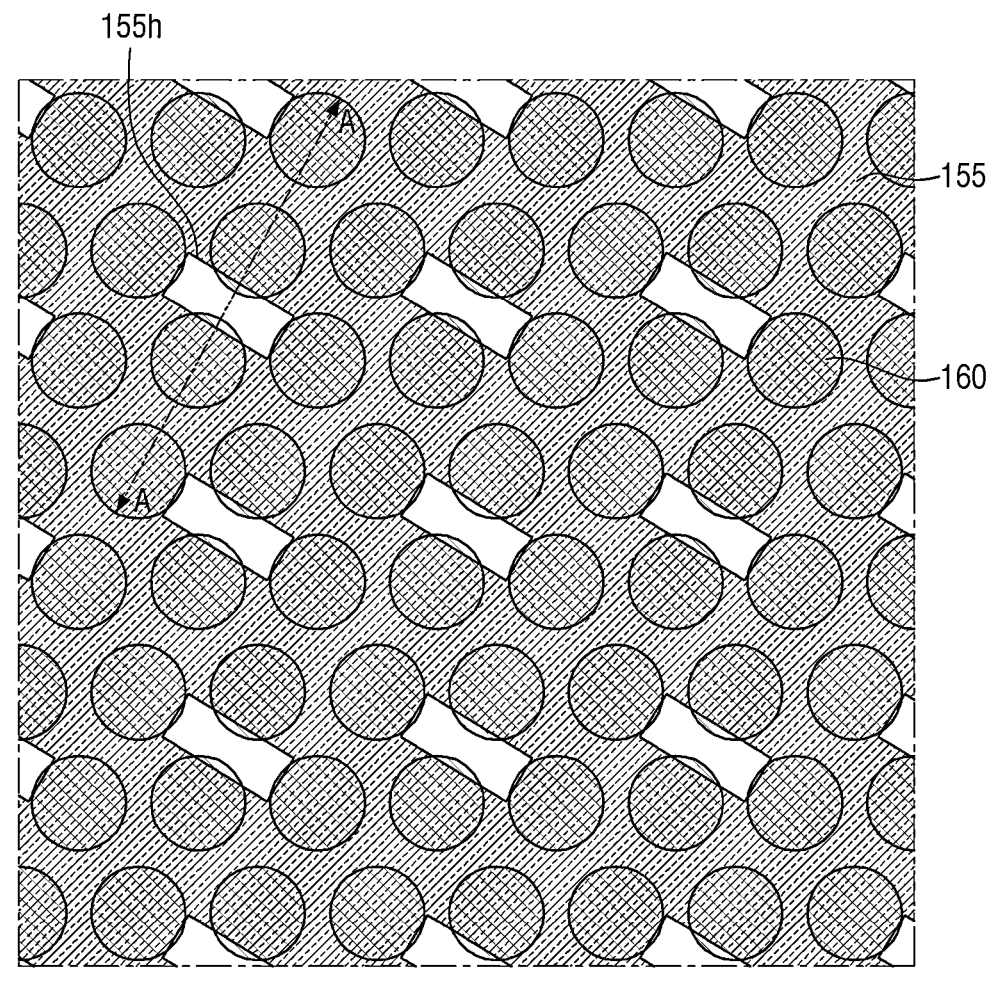
Figure 29:
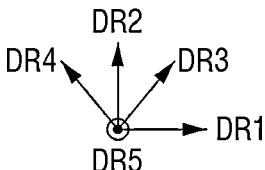

FIG. 28 and FIG. 29 are diagrams for illustrating mask patterns according to some example embodiments, respectively.

Referring to FIG. 28 and FIG. 29, in the mask pattern 155 according to some example embodiments, the mask hole 155h may expose at least a portion of each of the two lower electrodes 160 neighboring each other in the fourth direction DR4. The mask hole 155h may be disposed between the four lower electrodes 160 adjacent to each other around a center of the mask hole 155h.

The mask hole 155h may have various shapes as long as the mask hole 155h exposes at least a portion of each of the two lower electrodes 160 adjacent to each other in the fourth direction DR4. For example, the mask hole 155h may have a rectangle shape. The mask hole 155h may expose at least a portion of each of the four lower electrodes 160 adjacent to each other around a center of the mask hole 155h.

Referring to FIG. 28, the mask hole 155h may have a rectangle shape extending in an elongate manner in the first direction DR1. Referring to FIG. 29, the mask hole 155h may have a rectangle shape extending in an elongate manner in the fourth direction DR4.

Figure 30:
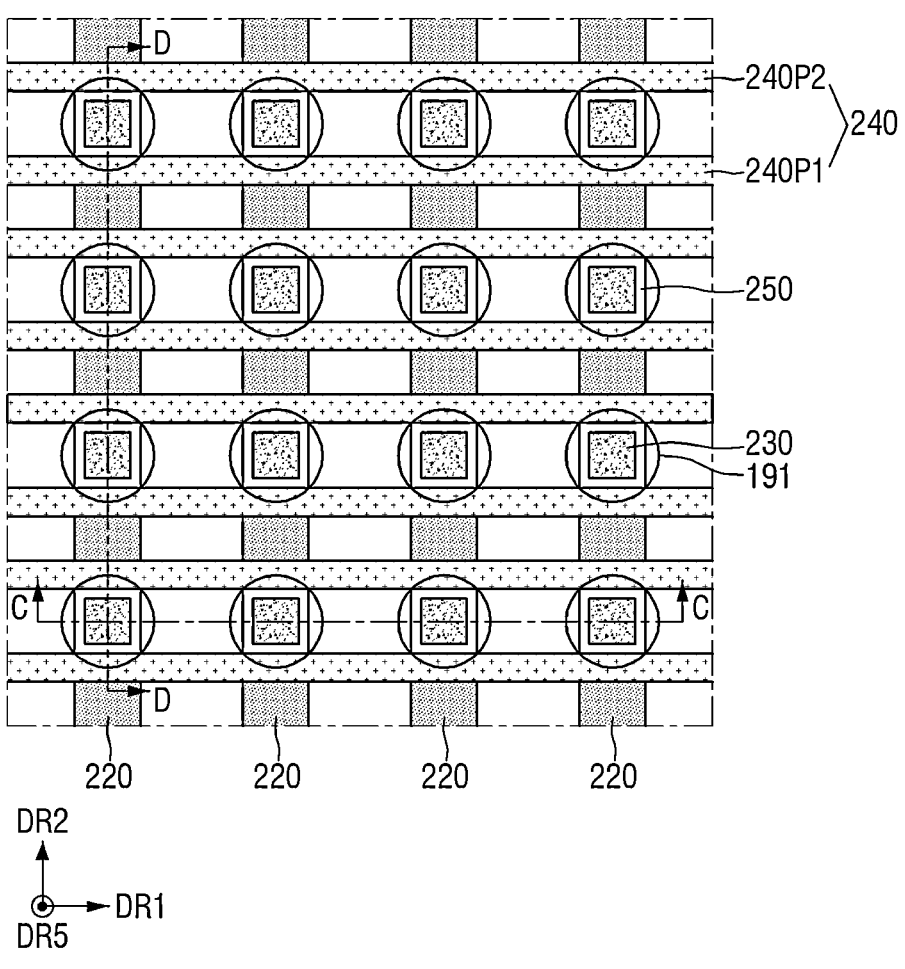
FIG. 30 is a layout diagram for illustrating a semiconductor memory device according to some example embodiments.
Figure 31:
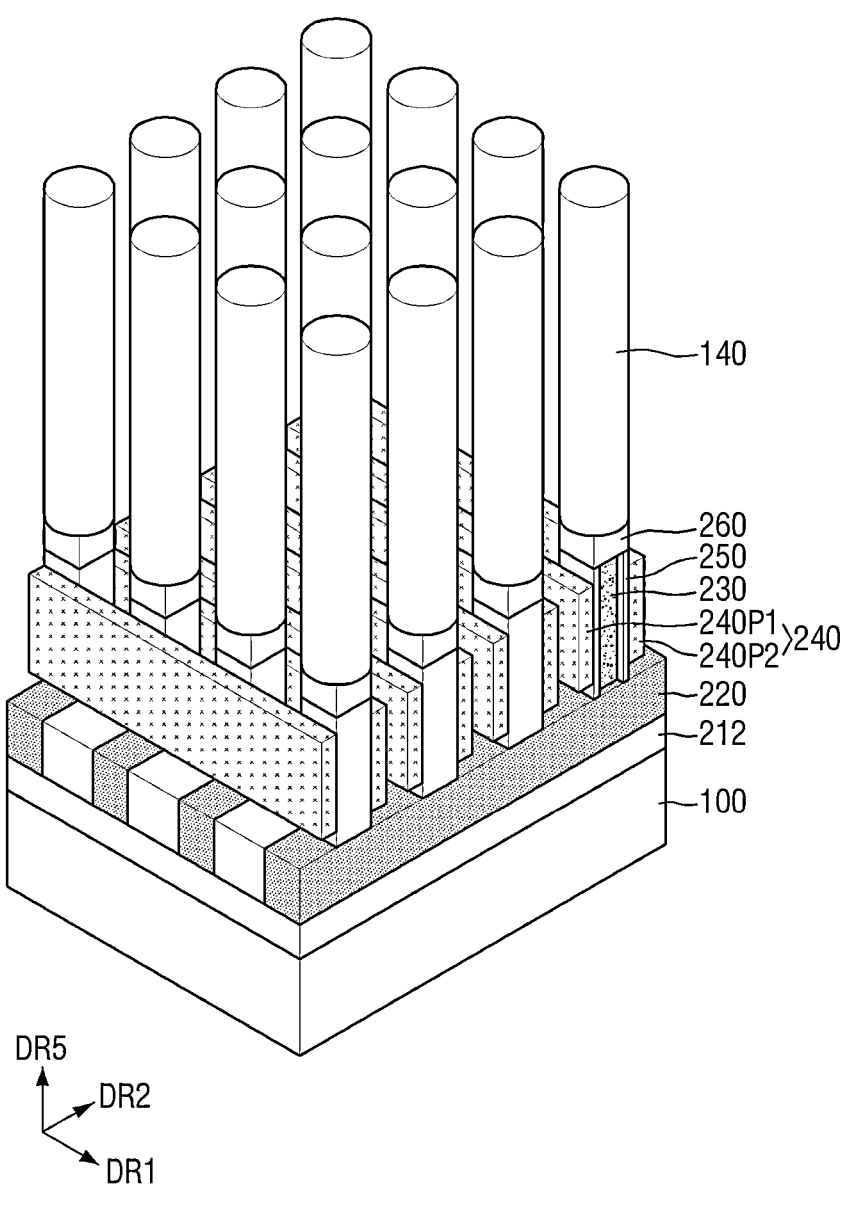
FIG. 31 is a perspective view for illustrating a semiconductor memory device according to some example embodiments.
Figure 32:
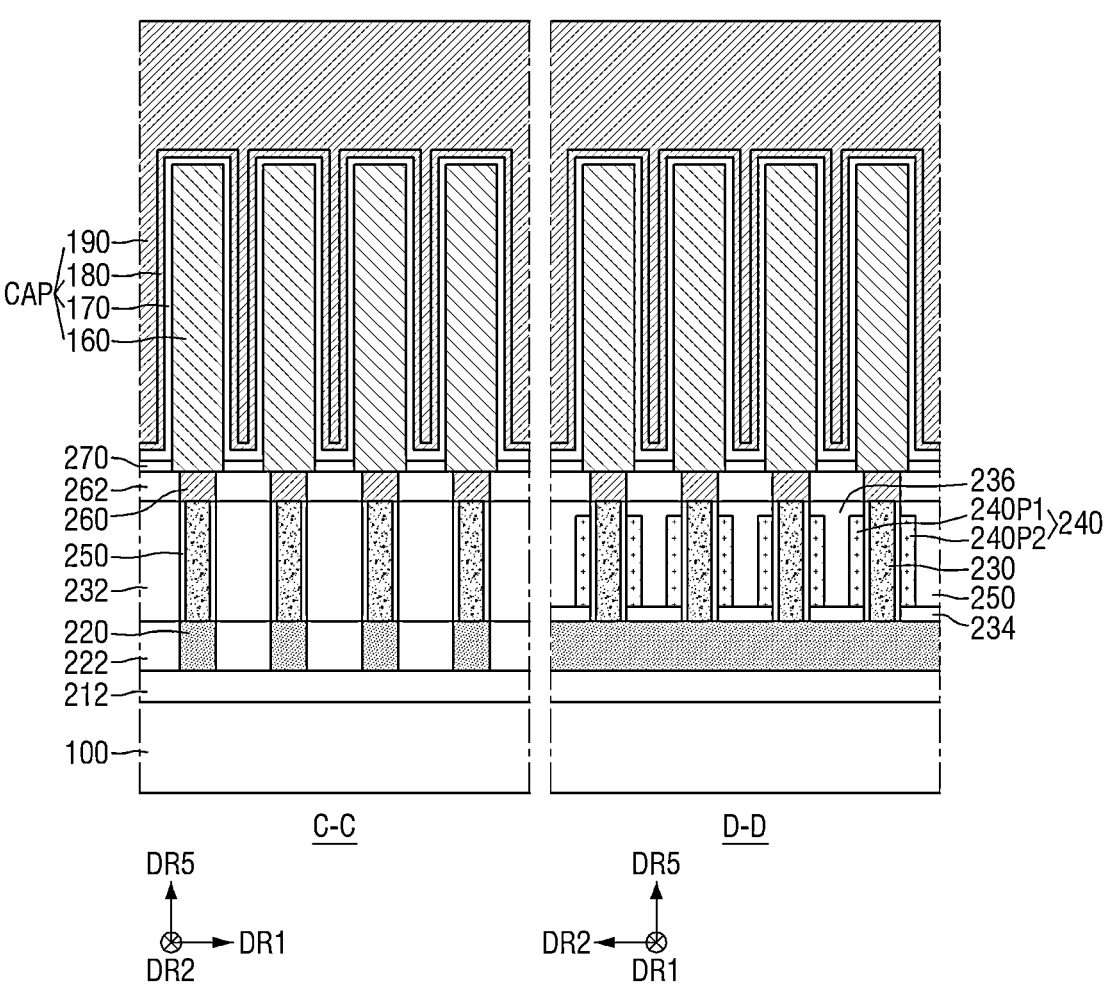
FIG. 32 is a cross-sectional view taken along a line C-C and a line D-D of FIG. 31.

FIG. 30 is a layout diagram for illustrating a semiconductor memory device according to some example embodiments. FIG. 31 is a perspective view for illustrating a semiconductor memory device according to some example embodiments. FIG. 32 is a cross-sectional view taken along a line C-C and a line D-D of FIG. 31.

Referring to FIG. 30 to FIG. 32, the semiconductor memory device according to some example embodiments may include the substrate 100, a plurality of first conductive lines 220, a channel layer 230, a gate electrode 240, a gate insulating film 250, and the capacitor CAP. The semiconductor memory device according to some example embodiments may be embodied as a memory device including a vertical channel transistor (VCT). The vertical channel transistor may have a structure in which a channel length of the channel layer 230 extends along a vertical direction from the substrate 100.

A lower insulating layer 212 may be disposed on the substrate 100. The plurality of first conductive lines 220 may be formed on the lower insulating layer 212 and may be arranged and spaced apart from each other in the first direction DR1 and extend in the second direction DR2. A plurality of first insulating patterns 222 may be disposed on the lower insulating layer 212 so as to respectively fill spaces between the plurality of first conductive lines 220. The plurality of first insulating patterns 222 may extend in the second direction DR2. A top face of the plurality of first insulating patterns 222 may be coplanar with a top face of the plurality of first conductive lines 220. Restated, the top surface of the plurality of first insulating patterns 222 may have the same height as the top surface of the plurality of first conductive lines 220 relative to the substrate 100. The plurality of first conductive lines 220 may function as bit-lines.

Each of (or alternatively, at least one of) the plurality of first conductive lines 220 may include at least one of a doped semiconductor material, a metal, a metal alloy, a conductive metal nitride, a conductive metal silicide, a conductive metal oxide, or a combination thereof. For example, each of the plurality of first conductive lines 220 may include at least one of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrO), ruthenium oxide (RuO), or combinations thereof. However, the present disclosure is not limited thereto. Each of the plurality of first conductive lines 220 may include a single layer or multiple layers made of the aforementioned materials. In some example embodiments, each of (or alternatively, at least one of) the plurality of first conductive lines 220 may include graphene, carbon nanotube, or a combination thereof.

The channel layers 230 may be arranged in a matrix form and may be spaced apart from each other in the first direction DR1 and the second direction DR2 and may be disposed on the plurality of first conductive lines 220. The channel layer 230 may have a first width along the first direction DR1 and a first vertical dimension along the fifth direction DR5. The first vertical dimension may be larger than the first width. For example, the first vertical dimension may be about 2 to 10 times the first width. However, the present disclosure is not limited thereto. In this regard, the fifth direction DR5 intersects the first direction DR1 and the second direction DR2, and may be, for example, a direction perpendicular to the top face of the substrate 100. A bottom portion of the channel layer 230 may function as a first source/drain area (not shown), and a top portion of the channel layer 230 may function as a second source/drain area (not shown), and a portion of the channel layer 230 between the first and second source/drain areas may function as a channel area (not shown).

In some example embodiments, the channel layer 230 may include an oxide semiconductor. For example, the oxide semiconductor may include Indiums Gallium$_y$ Zinc$_z$ Oxide (In$_x$Ga$_y$Zn$_z$O), Indium$_x$ Gallium$_y$ Silicon$_z$ Oxide (In$_x$Ga$_y$-Si$_z$O), Indium$_x$ Tin$_y$ Zinc$_z$ Oxide (In$_x$Sn$_y$Zn$_z$O), Indium$_x$ Zinc$_y$ Oxide (In$_x$Zn$_y$O), Zinc Oxide (Zn$_x$O), Zinc$_x$ Tin$_y$ Oxide (Zn$_x$Sn$_y$O), Zinc Oxygen$_x$ Nitride (Zn$_x$O$_y$N), Zerconium$_x$ Zinc$_y$ Tin$_z$ Oxide (Zr$_x$Zn$_y$Sn$_z$O), Tin$_x$ Oxide (Sn$_x$O), Hafnium$_x$ Indium$_y$ Zinc$_z$ Oxide (Hf$_x$In$_y$Zn$_z$O), Gallium$_y$ Zinc$_y$ Tin$_z$ Oxide (Ga$_x$Zn$_y$Sn$_z$O), Aluminum$_x$ Zinc$_y$ Tin$_z$ Oxide (Al$_x$Zn$_y$Sn$_z$O), Ytterbium Gallium$_y$ Zinc$_z$ Oxide (Yb$_x$-Ga$_y$Zn$_z$O), Indiums Gallium$_y$ Oxide (In$_x$Ga$_y$O) or combinations thereof. The channel layer 230 may include a single layer or multiple layers made of the oxide semiconductor. In some example embodiments, the channel layer 230 may have a bandgap energy greater than that of silicon. For example, the channel layer 230 may have a bandgap energy of about 1.5 eV to about 5.6 eV. For example, the channel layer 230 may have optimal channel performance when it has a bandgap energy of about 2.0 eV to 4.0 eV. For example, the channel layer 230 may be made of polycrystalline or amorphous. However, the present disclosure is not limited thereto. In some example embodiments, the channel layer 230 may include a two-dimensional (2D) semiconductor material. For example, the 2D semiconductor material may include graphene, carbon nanotubes, or a combination thereof.

The gate electrode 240 may extend in the first direction DR1 and may be disposed on each of both opposing sidewalls of the channel layer 230. The gate electrode 240 may include a first sub-gate electrode 240P1 facing a first sidewall of the channel layer 230 and a second sub-gate electrode 240P2 facing a second sidewall opposite to the first sidewall of the channel layer 230. As one channel layer 230 is disposed between the first sub-gate electrode 240P1 and the second sub-gate electrode 240P2, the semiconductor device may have a dual gate transistor structure. However, the technical idea of the present disclosure is not limited thereto, and the second sub-gate electrode 240P2 may be omitted and only the first sub-gate electrode 240P1 facing the first sidewall of the channel layer 230 may be formed to achieve a single gate transistor structure. A material of the gate electrode 240 may be the same as that of the gate electrode 320.

The gate insulating film 250 surrounds a sidewall of the channel layer 230 and may be interposed between the channel layer 230 and the gate electrode 240. For example, as shown in FIG. 30, an entirety of the sidewall of the channel layer 230 may be surrounded with the gate insulating film 250, or a portion of the sidewall of the gate electrode 240 may be in contact with the gate insulating film 250. In some further example embodiments, the gate insulating film 250 may extend in an extension direction of the gate electrode 240, that is, the first direction DR1, and only two sidewalls facing the gate electrode 440 among the sidewalls of the channel layer 430 may be in contact with the gate insulating layer 450. In some example embodiments, the gate insulating film 250 may include at least one of a silicon oxide film, a silicon oxynitride film, a film made of a high-k material having a higher dielectric constant than that of silicon oxide, or combinations thereof.

A plurality of second insulating patterns 232 may be respectively disposed on the plurality of first insulating patterns 422 and may extend along the second direction DR2. The channel layer 230 may be disposed between two adjacent second insulating patterns 232 among the plurality of second insulating patterns 232. Further, a first buried layer 234 and a second buried layer 236 may be disposed between two adjacent second insulating patterns 232 and in a space between two adjacent channel layers 430. The first buried layer 234 may be disposed at a bottom portion of the space between two adjacent channel layers 430, and the second buried layer 236 may be formed on the first buried layer 234 so as to fill the remainder of the space between two adjacent channel layers 230. A top face of the second buried layer 236 may be coplanar with a top face of the channel layer 230, and the second buried layer 236 may cover a top face of the gate electrode 240. Alternatively, the plurality of second insulating patterns 232 may be continuous and monolithic with the plurality of first insulating patterns 222, respectively, or the second buried layer 236 may be continuous and monolithic with the first buried layer 234.

A capacitor contact 260 may be disposed on the channel layer 230. The capacitor contact 260 may vertically overlap the channel layer 230. The capacitor contacts 260 may be arranged in a matrix form and may be spaced apart from each other in the first direction DR1 and the second direction DR2. The capacitor contact 260 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RUO$_x$, or a combination thereof. However, the present disclosure is not limited thereto. An upper insulating layer 262 may surround a sidewall of the capacitor contact 260 and may be disposed on the plurality of second insulating patterns 232 and the second buried layer 236.

A second etch stop film 270 may be disposed on the upper insulating layer 262. The capacitor CAP may be disposed on the second etch stop film 270. The capacitor CAP may include the lower electrode 160, the capacitor dielectric film 170, the upper electrode 180 and the upper plate electrode 190. The lower electrode 160 may extend through the second etch stop film 270 and then be electrically connected to a top face of the capacitor contact 260. The lower electrode 160 may be formed in a pillar type extending in the fifth direction DR5. However, the present disclosure is not limited thereto. In some example embodiments, the lower electrode 160 may vertically overlap with the capacitor contact 260 and the lower electrodes 160 may be arranged in a matrix form and may be spaced apart from each other in the first direction DR1 and the second direction DR2. Alternatively, a landing pad (not shown) may be further disposed between the capacitor contact 260 and the lower electrode 160 so that the lower electrodes 160 may be arranged in a hexagonal manner.

The capacitor CAP may be embodied as the capacitor CAP described above with reference to FIG. 1 to FIG. 13. The capacitor CAP may include the supporters 130, 140, and 150 as described above with reference to FIG. 1 to FIG. 13.

Figure 33:
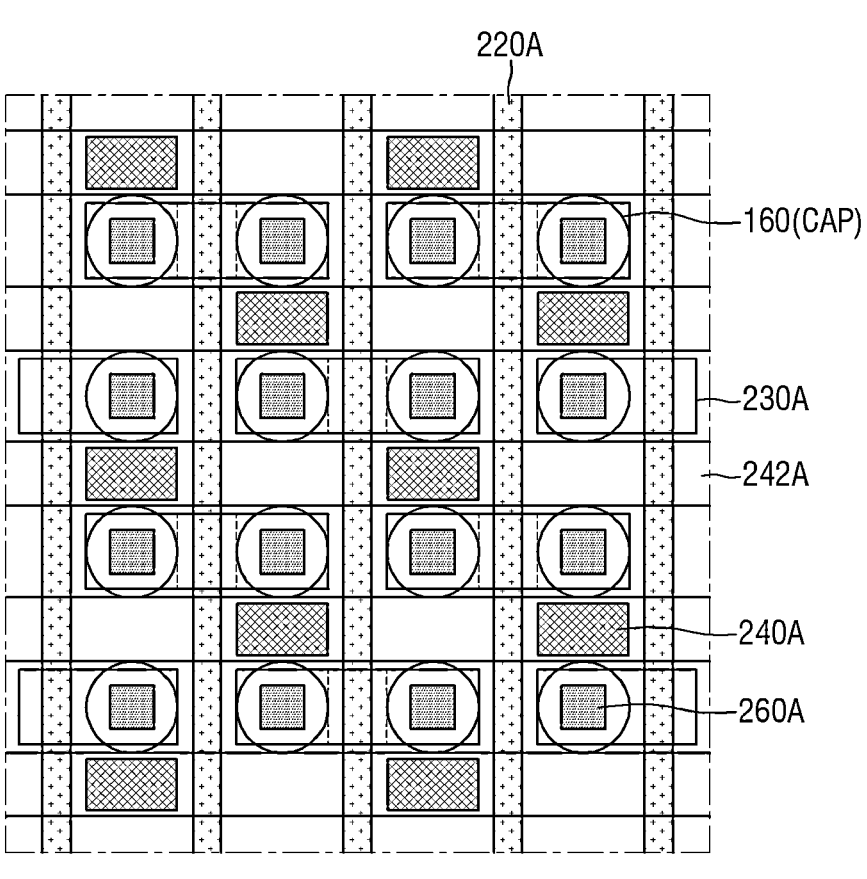
FIG. 33 is a layout diagram for illustrating a semiconductor memory device according to some example embodiments.
Figure 33:
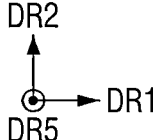
Figure 34:
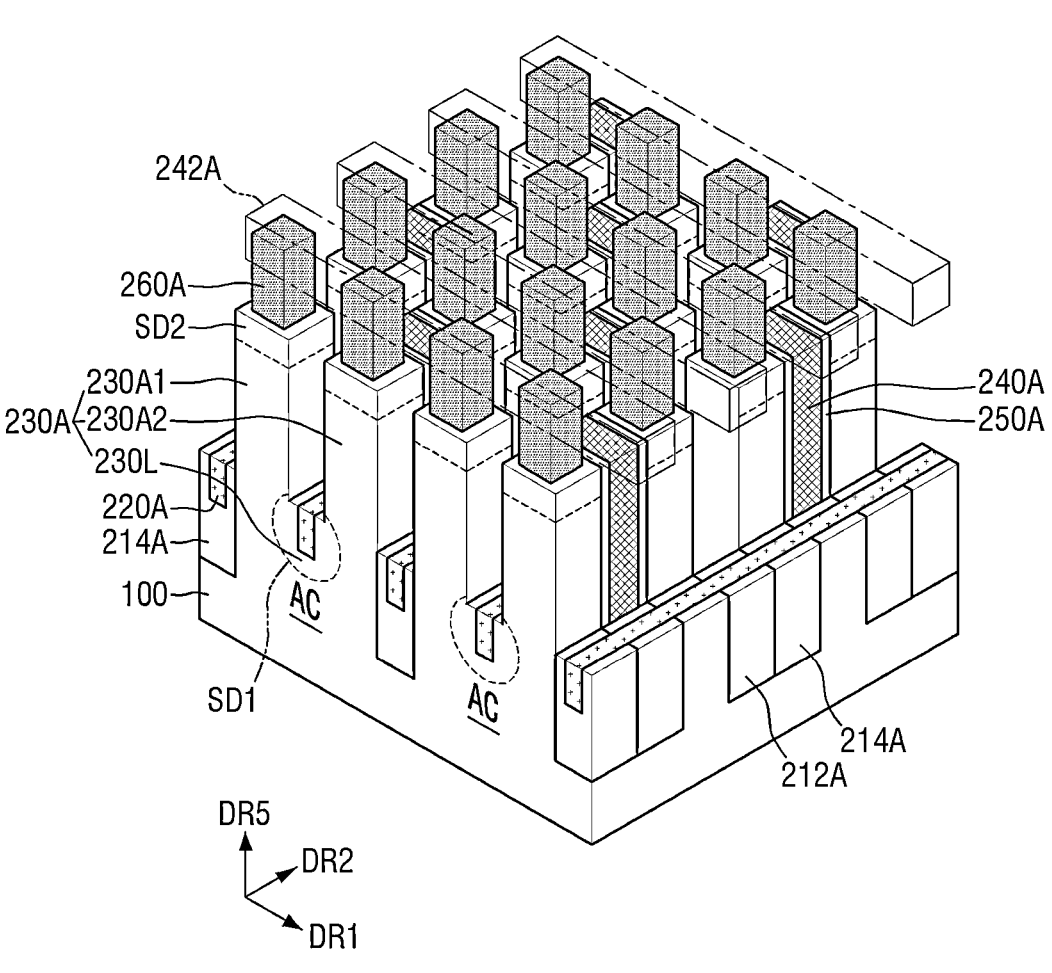
FIG. 34 is a perspective view for illustrating a semiconductor memory device according to some example embodiments.

FIG. 33 is a layout diagram for illustrating a semiconductor memory device according to some example embodiments. FIG. 34 is a perspective view for illustrating a semiconductor memory device according to some example embodiments.

Referring to FIG. 33 and FIG. 34, the semiconductor memory device according to some example embodiments includes the substrate 100, a plurality of first conductive lines 220A, a channel structure 230A, a contact gate electrode 240A, a plurality of second conductive lines 242A, and the capacitor CAP. The semiconductor memory device according to some example embodiments may be embodied as a memory device including a vertical channel transistor (VCT).

A plurality of active areas AC may be defined in the substrate 100 and by a first element isolation pattern 212A and a second element isolation pattern 214A. The channel structure 230A may be disposed in each active area AC. The channel structure 230A may include a first active pillar 230A1 and a second active pillar 230A2 extending in a vertical direction, and a connective portion 230L connected to a bottom portion of the first active pillar 230A1 and a bottom portion of the second active pillar 230A2. A first source/drain area SD1 may be disposed in the connective portion 230L. A second source/drain area SD2 may be disposed at a top portion of each of the first and second active pillars 230A1 and 230A2. Each of the first active pillar 230A1 and the second active pillar 230A2 may constitute an independent unit memory cell.

The plurality of first conductive lines 220A may extend so as to intersect the plurality of active areas AC. For example, the plurality of first conductive lines 220A may extend in the second direction DR2. One first conductive line 220A of the plurality of first conductive lines 220A may be disposed on the connective portion 230L and between the first active pillar 230A1 and the second active pillar 230A2, and may be disposed on the first source/drain area SD1. Another first conductive line 220A adjacent to said one first conductive line 220A may be disposed between two channel structures 230A. One first conductive line 220A among the plurality of first conductive lines 220A may function as a common bit-line of two unit memory cells respectively including the first active pillar 230A1 and the second active pillar 230A2 respectively disposed on both opposing sides of said one first conductive line 220A.

One contact gate electrode 240A may be disposed between two channel structures 230A adjacent to each other in the second direction DR2. For example, the contact gate electrode 240A may be disposed between the first active pillar 230A1 included in one channel structure 230A and the second active pillar 230A2 of another channel structure 230A adjacent thereto. One contact gate electrode 240 may be shared by the first active pillar 230A1 and the second active pillar 230A2 respectively disposed on both sidewalls thereof. A gate insulating layer 250A may be disposed between the contact gate electrode 240A and the first active pillar 230A1 and between the contact gate electrode 240A and the second active pillar 230A2. A plurality of second conductive lines 242A may extend in the first direction DR1 and may be disposed on a top face of the contact gate electrode 240A. Each of (or alternatively, at least one of) the plurality of second conductive lines 242A may function as a word-line of the semiconductor device.

A capacitor contact 260A may be disposed on the channel structure 230A. The capacitor contact 260A may be disposed on the second source/drain area SD2, and the capacitor CAP may be disposed on the capacitor contact 260A.

The capacitor CAP may be embodied as the capacitor CAP as described above with reference to FIG. 1 to FIG. 13. The capacitor CAP may include the supporters 130, 140, and 150 as described above with reference to FIG. 1 to FIG. 13.

Figure 35:
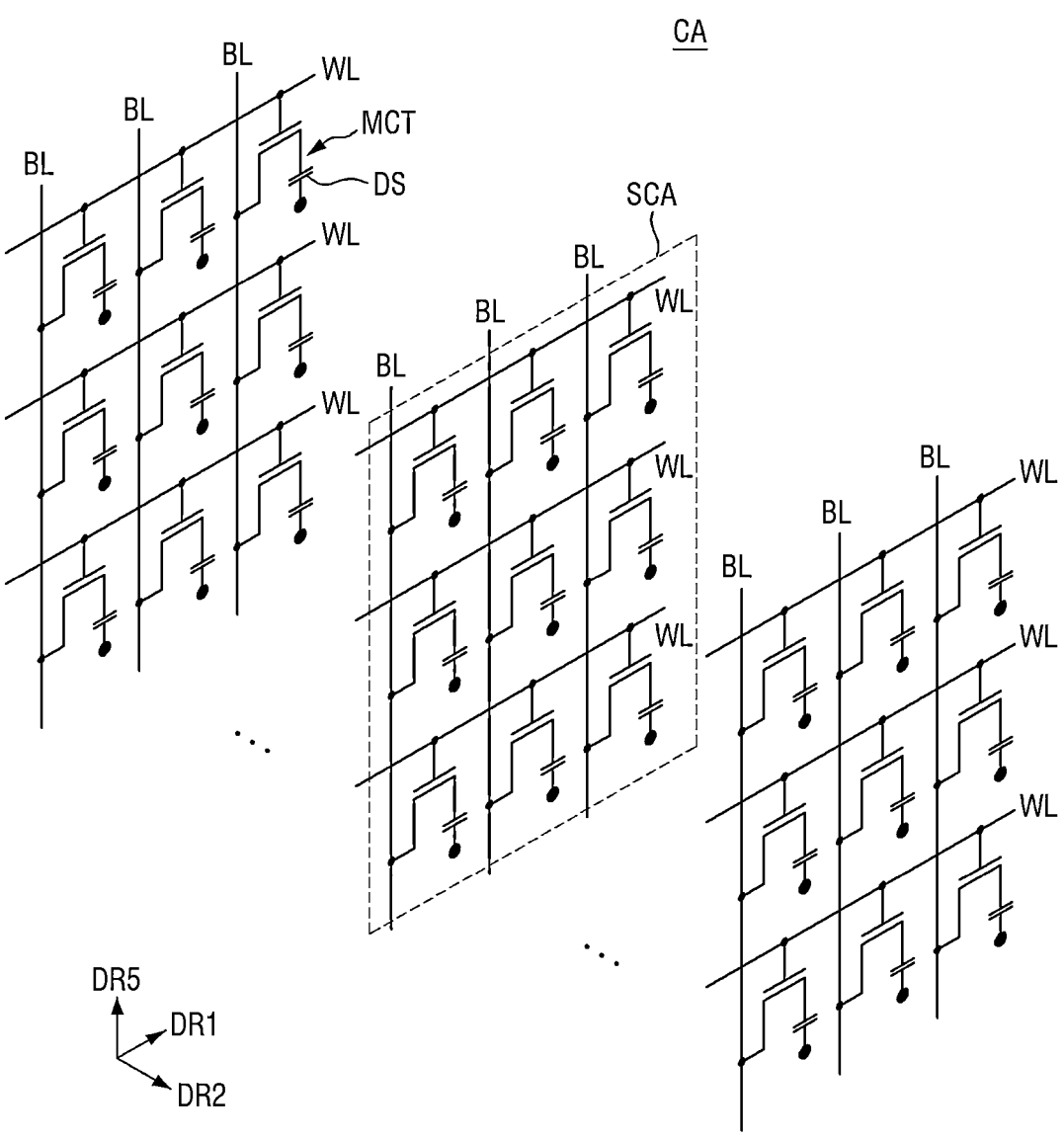
FIG. 35 is a simplified circuit diagram illustrating a cell array of a semiconductor memory device according to some example embodiments.
Figure 36:
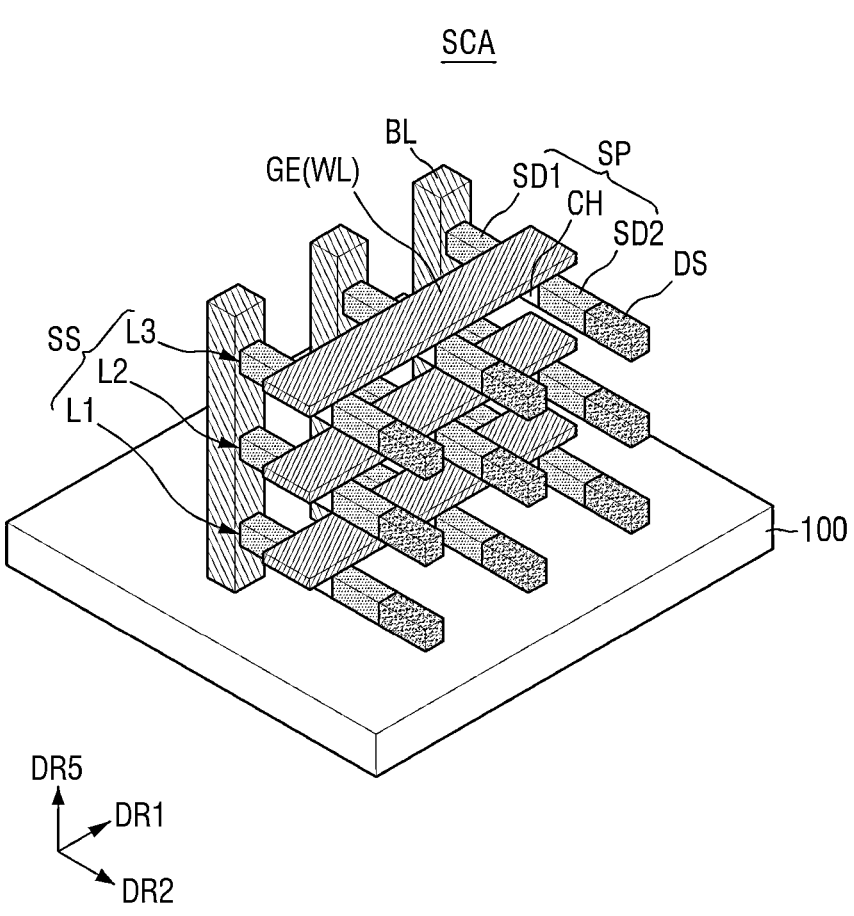
FIG. 36 to FIG. 38 are illustrative perspective views illustrating semiconductor memory devices according to some example embodiments, respectively.
Figure 37:
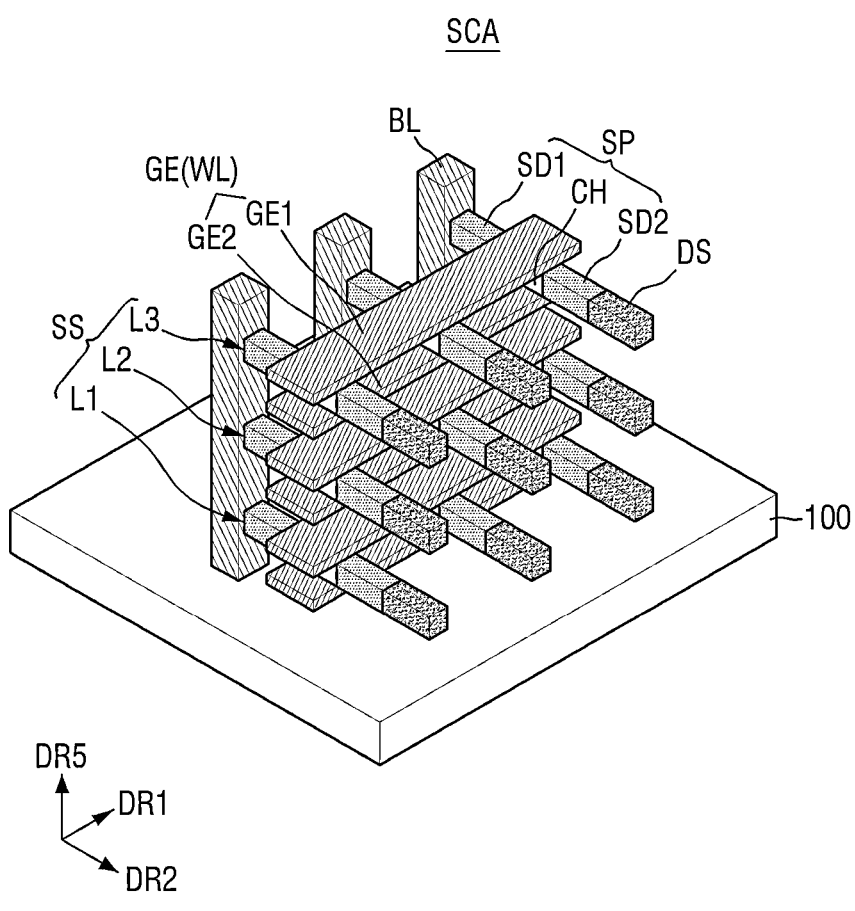
Figure 38:
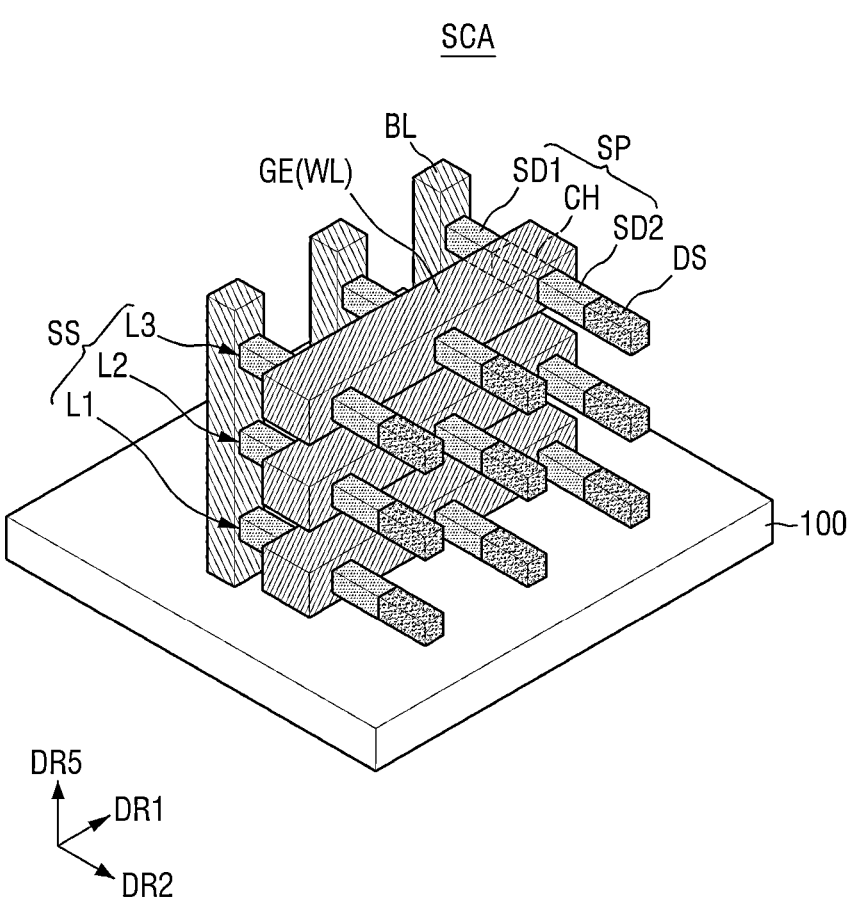

FIG. 35 is a simplified circuit diagram illustrating a cell array of a semiconductor memory device according to some example embodiments. FIG. 36 to FIG. 38 are illustrative perspective views illustrating semiconductor memory devices according to some example embodiments, respectively.

Referring to FIG. 35, a cell array CA of a semiconductor device according to some example embodiments may include a plurality of sub-cell arrays SCA. The sub-cell arrays SCA may be arranged along the second direction DR2.

Each of (or alternatively, at least one of) the sub-cell arrays SCA may include a plurality of bit-lines BL, a plurality of word-lines WL, and a plurality of memory cell transistors MCT. One memory cell transistor MCT may be disposed between one word-line WL and one bit-line BL.

The bit-lines BL may be embodied as conductive patterns (for example, metallic conductive lines) extending from the substrate in a direction perpendicular to the substrate, that is, in the fifth direction D5. The bit-lines BL in one sub-cell array SCA may be arranged in the first direction DR1. The bit-lines BL adjacent to each other may be spaced apart from each other in the first direction DR1.

The word-lines WL may be embodied as conductive patterns (for example, metallic conductive lines) arranged on the substrate in the fifth direction DR5. Each of the word-lines WL may extend in the first direction DR1. The word-lines BL adjacent to each other may be spaced apart from each other in the fifth direction D5.

A gate of the memory cell transistor MCT may be connected to the word-line WL, and a first source/drain of the memory cell transistor MCT may be connected to the bit-line BL. A second source/drain of the memory cell transistor MCT may be connected to an information storage element DS. For example, the information storage element DS may be embodied as a capacitor. The information storage element DS may be embodied as the capacitor CAP as described above with reference to FIG. 1 to FIG. 13. The second source/drain of the memory cell transistor MCT may be connected to the lower electrode 160 of the capacitor CAP. The capacitor CAP may include the supporters 130, 140, and 150 as described above with reference to FIG. 1 to FIG. 13.

Referring to FIG. 35 and FIG. 36, one sub-cell array of the plurality of sub-cell arrays SCA as described above with reference to FIG. 35 may be disposed on the substrate 100.

A stack structure SS including first to third layers L1, L2, and L3 may be disposed on the substrate 100. The first to third layers L1, L2, and L3 of the stack structure SS may be stacked on top of each other and spaced apart from each other in a direction perpendicular to a top face of the substrate 100, that is, in the fifth direction DR5.

Each of (or alternatively, at least one of) the first to third layers L1, L2, and L3 may include a plurality of semiconductor patterns SP, a plurality of information storage elements DS, and a gate electrode GE.

The semiconductor pattern SP may have a line shape or a bar shape extending in the second direction DR2. The semiconductor pattern SP may include a semiconductor material such as silicon, germanium, or silicon-germanium. In one example, the semiconductor pattern SP may include at least one of polysilicon, polysilicon germanium, single crystal silicon, and single crystal silicon-germanium.

Each semiconductor pattern SP may include a channel area CH, a first impurity area SD1, and a second impurity area SD2. The channel area CH may be interposed between the first and second impurity areas SD1 and SD2. The channel area CH may act as a channel of the memory cell transistor MCT as described above with reference to FIG. 35. The first and second impurity areas SD1 and SD2 may correspond to the first source/drain and the second source/drain of the memory cell transistor MCT as described above with reference to FIG. 35, respectively.

Each of the first and second impurity areas SD1 and SD2 may refer to an area in which impurities are doped into the semiconductor pattern SP. Accordingly, each of the first and second impurity areas SD1 and SD2 may have a conductivity type of an n-type or a p-type. The first impurity area SD1 may be formed adjacent to a first end of the semiconductor pattern SP, and the second impurity area SD2 may be formed adjacent to a second end of the semiconductor pattern SP1. The second end may face the first end in the second direction DR2.

The first impurity area SD1 may be formed adjacent to the bit-line BL. The first impurity area SD1 may be connected to the bit-line BL. The second impurity area SD2 may be formed adjacent to the information storage element DS. The second impurity area SD2 may be connected to the information storage element DS.

The information storage element DS may refer to a memory element capable of storing data therein. Each information storage element DS may be embodied as a memory element using a capacitor, a memory element using a magnetic tunnel junction pattern, or a memory element using a variable resistor including a phase change material. In one example, each information storage element DS may be embodied as a capacitor.

The gate electrode GE may have a line shape or a bar shape extending in the first direction DR1. The gate electrodes GE may be stacked on top of each other and spaced apart from each other along the fifth direction DR5. Each gate electrode GE may extend in the first direction DR1 and across the semiconductor pattern SP in one layer. In other words, the gate electrode GE may act as a horizontal word-line WL as described above with reference to FIG. 35. A material of the gate electrode GE may be the same as that of the gate electrode 320.

A plurality of bit-lines BL extending in the fifth direction DR5 may be disposed on the substrate 100. Each bit-line BL may have a line shape or a column shape extending in the fifth direction DR5. The bit-lines BL may be arranged along the first direction DR1. Each bit-line BL may be electrically connected to the first impurity area SD1 of each of the vertically stacked semiconductor patterns SP.

The bit-line BL may include a conductive material, for example, at least one of a doped semiconductor material, a conductive metal nitride, a metal, and a metal-semiconductor compound. However, the present disclosure is not limited thereto.

Each layer of the stack structure of the first to third layers L1, L2, and L3 will be described below in detail based on the first layer L1. The semiconductor patterns SP of the first layer L1 may be arranged in the first direction DR1. The semiconductor patterns SP of the first layer L1 may be located at the same vertical level. The gate electrode GE of the first layer L1 may extend across the semiconductor pattern SP of the first layer L1 and may extend in the first direction DR1. For example, the gate electrode GE of the first layer L1 may be disposed on a top face of the semiconductor pattern SP2.

Although not shown, a gate insulating film may be interposed between the gate electrode GE and the channel area CH.

Each bit-line BL may be connected to a first end of the semiconductor pattern SP of the first layer L1. In one example, the bit-line BL may be directly connected to the first impurity areas SD1. In another example, the bit-line BL may be electrically connected to the first impurity area SD1 via metal silicide. A detailed description of each of the second layer L2 and the third layer L3 may be substantially the same as that of the first layer L1 as set forth above.

Although not shown, empty spaces in the stack structure SS may be filled with an insulating material. For example, the insulating material may include at least one of a silicon oxide film, a silicon nitride film, and a silicon oxynitride film. A wiring layer electrically connected to the sub-cell array SCA may be disposed on the stack structure SS.

Although not shown, a peripheral circuit for operating the sub-cell array SCA may be formed on the substrate 100. Using the wiring layer, the peripheral circuit and the sub-cell array may be connected to each other.

Referring to FIG. 35 and FIG. 37, the gate electrode GE may include a first gate electrode GE1 on a top face of the semiconductor pattern SP and a second gate electrode GE2 on a bottom face of the semiconductor pattern SP. In other words, in the semiconductor device according to some example embodiments, the memory cell transistor may be embodied as a double gate transistor in which the two gate electrodes GE are respectively disposed on top and bottom faces of the channel area CH.

Referring to FIG. 35 and FIG. 38, the gate electrode GE may surround the channel area CH of the semiconductor pattern SP. The gate electrode GE may be disposed on the top face, the bottom face and both opposing sidewalls of the channel area CH. In other words, in the semiconductor device according to some example embodiments, the memory cell transistor may be embodied as a gate-all-around transistor in which the gate electrode GE surrounds the channel area CH.

In other words, the gate electrode GE may include the first gate electrode GE1 and the second gate electrode GE2 as described above with reference to FIG. 37, and a connection gate electrode connecting the first gate electrode GE1 and the second gate electrode GE2 to each other. The connection gate electrode may be disposed between the semiconductor patterns SP spaced apart from each other in the first direction DR1 and disposed at the same vertical level.

Although the example embodiments of the present disclosure have been described above with reference to the accompanying drawings, the present disclosure is not limited to the above example embodiments, but may be implemented in various different forms. A person skilled in the art will be able to appreciate that the present disclosure may be embodied in other concrete forms without changing the technical spirit or essential characteristics of the present disclosure. Therefore, it should be understood that the example embodiments as described above are not restrictive but illustrative in all respects.

What is claimed is:

1. A semiconductor device comprising:
a substrate;
a plurality of lower electrodes on the substrate and arranged in a honeycomb structure; and
a supporter connecting the plurality of lower electrodes to each other, the supporter having a plurality of supporter holes defined therein, and the plurality of supporter holes exposing at least a portion of each of the plurality of lower electrodes,
wherein the supporter includes
a plurality of first extensions and a plurality of second extensions that define the plurality of supporter holes,
the plurality of first extensions extending in a first direction, and the plurality of first extensions being arranged in a second direction perpendicular to the first direction, and
the plurality of second extensions extending in the second direction, the plurality of second extensions intersecting the plurality of first extensions, and the plurality of second extensions being arranged in the first direction,
wherein each of the plurality of first extensions has a first sidewall and a second sidewall opposite to each other in the second direction,
wherein each of the plurality of second extensions has a third sidewall and a fourth sidewall opposite to each other in the first direction, and
wherein each of the first sidewall, the second sidewall, the third sidewall and the fourth sidewall includes a convex portion and a concave portion between adjacent lower electrodes from among the plurality of lower electrodes.

2. The semiconductor device of claim 1, wherein the plurality of lower electrodes include a first lower electrode, a second lower electrode, a third lower electrode and a fourth lower electrode arranged in a quadrangle manner,
wherein a first supporter hole of the plurality of supporter holes exposes at least a portion of each of the first lower electrode, the second lower electrode, the third lower electrode and the fourth lower electrode,
wherein the first lower electrode and the second lower electrode are adjacent to each other in the first direction,
wherein the third lower electrode and the fourth lower electrode are adjacent to each other in the first direction,
wherein the second lower electrode and the third lower electrode are adjacent to each other in a third direction, the third direction being between the first direction and the second direction.

3. The semiconductor device of claim 1, wherein the plurality of lower electrodes include a first lower electrode, a second lower electrode, a third lower electrode and a fourth lower electrode arranged in a quadrangle manner,
wherein a first supporter hole of the plurality of supporter holes exposes at least a portion of each of the first lower electrode, the second lower electrode, the third lower electrode and the fourth lower electrode,
wherein an area by which the first lower electrode is exposed through the plurality of supporter holes is different from each of an area by which the second lower electrode is exposed through the plurality of supporter holes, an area by which the third lower electrode is exposed through the plurality of supporter holes, and an area by which the fourth lower electrode is exposed through the plurality of supporter holes.

4. The semiconductor device of claim 1, wherein each of the plurality of lower electrodes includes:
a first film defining a trench; and
a second film on the first film, the second film filling the trench.

5. The semiconductor device of claim 4, wherein a material of the second film is different from a material of the first film.

6. The semiconductor device of claim 4, wherein a vertical level of a top face of the first film is higher than a vertical level of a top face of the second film.

7. The semiconductor device of claim 4, wherein a top face of the first film is coplanar with a top face of the second film.

8. The semiconductor device of claim 4, wherein the second film includes:
a third film filling a portion of the trench; and
a fourth film on the third film, the fourth film filling a remaining portion of the trench.

9. A semiconductor device comprising:
a substrate;
a plurality of lower electrodes on the substrate and arranged in a honeycomb structure; and
a supporter connecting the plurality of lower electrodes to each other, the supporter having a plurality of supporter holes defined therein, each of the plurality of supporter holes exposing at least a portion of at least one of the plurality of lower electrodes,
wherein the supporter includes
a plurality of first extensions extending in a first direction, and the plurality of first extensions being arranged in a second direction perpendicular to the first direction; and
a plurality of second extensions extending in the second direction, the plurality of second extensions intersecting the plurality of first extensions, and the plurality of second extensions being arranged in the first direction,
wherein the plurality of supporter holes include a first supporter hole,
wherein the plurality of first extensions include a first sub-extension and a second sub-extension defining the first supporter hole,
wherein the plurality of second extensions include a third sub-extension and a fourth sub-extension defining the first supporter hole, and
wherein at least one of the first sub-extension, the second sub-extension, the third sub-extension and the fourth sub-extension has a convex portion toward the first supporter hole.

10. The semiconductor device of claim 9, wherein the plurality of lower electrodes include a first lower electrode, a second lower electrode, a third lower electrode and a fourth lower electrode adjacent to each other around a center of the first supporter hole,
wherein the first lower electrode is in contact with the first sub-extension and the third sub-extension,
wherein the second lower electrode is in contact with the first sub-extension and the fourth sub-extension,
wherein the third lower electrode is in contact with the second sub-extension and the third sub-extension,
wherein the fourth lower electrode is in contact with the second sub-extension and the fourth sub-extension,
wherein a point at which the first lower electrode and the first sub-extension contact each other and a point at which the second lower electrode and the first sub-extension contact each other are not in a same line extending in the first direction.

11. The semiconductor device of claim 9, wherein the plurality of lower electrodes include a first lower electrode, a second lower electrode, a third lower electrode and a fourth lower electrode adjacent to each other around a center of the first supporter hole, wherein the first lower electrode is in contact with the first sub-extension and the third sub-extension, wherein the second lower electrode is in contact with the first sub-extension and the fourth sub-extension, wherein the third lower electrode is in contact with the second sub-extension and the third sub-extension, wherein the fourth lower electrode is in contact with the second sub-extension and the fourth sub-extension, wherein a point at which the third lower electrode and the second sub-extension contact each other and a point at which the fourth lower electrode and the second sub-extension contact each other are not in a same line extending in the first direction.

12. The semiconductor device of claim 9, wherein the plurality of lower electrodes include a first lower electrode, a second lower electrode, a third lower electrode and a fourth lower electrode adjacent to each other around a center of the first supporter hole, wherein the first lower electrode is in contact with the first sub-extension and the third sub-extension, wherein the second lower electrode is in contact with the first sub-extension and the fourth sub-extension, wherein the third lower electrode is in contact with the second sub-extension and the third sub-extension, wherein the fourth lower electrode is in contact with the second sub-extension and the fourth sub-extension, wherein a spacing between the first sub-extension and a first extension line extending through a center of the first lower electrode and a center of the second lower electrode is different from a spacing between the second sub-extension and a second extension line extending through a center of the third lower electrode and a center of the fourth lower electrode.

13. The semiconductor device of claim 9, wherein each of sidewalls of the first sub-extension, the second sub-extension, the third sub-extension and the fourth sub-extension of the supporter defining the first supporter hole is flat.

14. The semiconductor device of claim 9, wherein each of the plurality of lower electrodes includes a first film and a second film including different materials.

15. The semiconductor device of claim 9, wherein the plurality of lower electrodes include a first lower electrode, a second lower electrode, a third lower electrode and a fourth lower electrode adjacent to each other around a center of the first supporter hole, wherein each of the plurality of supporter holes exposes at least a portion of one of the first lower electrode, the second lower electrode, the third lower electrode and the fourth lower electrode.

16. A semiconductor device comprising:

a substrate;

a plurality of lower electrodes on the substrate and arranged in a honeycomb structure; and a supporter connecting the plurality of lower electrodes to each other, the supporter having a plurality of supporter holes defined therein, and the plurality of supporter holes exposing at least a portion of each of the plurality of lower electrodes, wherein the supporter includes a plurality of first extensions extending in a first direction, and the plurality of first extensions being arranged in a second direction perpendicular to the first direction; and a plurality of second extensions extending in the second direction, the plurality of second extensions intersecting the plurality of first extensions, and the plurality of second extensions being arranged in the first direction, wherein the plurality of lower electrodes include a first lower electrode, a second lower electrode, a third lower electrode and a fourth lower electrode arranged in a quadrangle manner, wherein a first supporter hole of the plurality of supporter holes exposes at least a portion of each of the first lower electrode, the second lower electrode, the third lower electrode and the fourth lower electrode, wherein the first lower electrode and the second lower electrode are adjacent to each other in a third direction, the third direction being between the first direction and the second direction, and wherein the third lower electrode and the fourth lower electrode are respectively adjacent to the first lower electrode and the second lower electrode in the first direction.

17. The semiconductor device of claim 16, wherein each of sidewalls of the supporter defining the plurality of supporter holes has a wavy shape.

18. The semiconductor device of claim 16, wherein each of sidewalls of the supporter defining the plurality of supporter holes is flat.

19. The semiconductor device of claim 16, wherein each of the plurality of lower electrodes includes:

a first film defining a trench; and a second film on the first film, the second film filling the trench.

20. The semiconductor device of claim 16, wherein each of the plurality of lower electrodes includes:

a first film defining a trench, and a second film on the first film, the second film filling a portion of the trench, the semiconductor device further comprises a capacitor dielectric film filling a remaining portion of the trench, the capacitor dielectric film extending along a profile of a corresponding lower electrode from among the plurality of lower electrodes and a profile of the supporter, and an upper electrode on the capacitor dielectric film.

* * * * *